(12) United States Patent
Shen et al.

(10) Patent No.: US 11,082,070 B2
(45) Date of Patent: Aug. 3, 2021

(54) CHANNEL INTERLEAVING METHOD AND APPARATUS

(71) Applicant: HUAWEI TECHNOLOGIES CO., LTD., Shenzhen (CN)

(72) Inventors: Hui Shen, Shenzhen (CN); Bin Li, Shenzhen (CN); Jiaqi Gu, Shenzhen (CN); Wen Tong, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/728,020

(22) Filed: Dec. 27, 2019

(65) Prior Publication Data
US 2020/0136655 A1  Apr. 30, 2020

Related U.S. Application Data

(63) Continuation of application No. PCT/CN2018/093042, filed on Jun. 27, 2018.

(30) Foreign Application Priority Data

Jun. 27, 2017 (CN) .......................... 201710501671.X

(51) Int. Cl.
*H03M 13/27* (2006.01)
*H03M 13/13* (2006.01)
*H04L 1/00* (2006.01)

(52) U.S. Cl.
CPC ....... *H03M 13/2792* (2013.01); *H03M 13/13* (2013.01); *H04L 1/0057* (2013.01); *H04L 1/0071* (2013.01)

(58) Field of Classification Search
CPC .............................................. H03M 13/2792
(Continued)

(56) References Cited

U.S. PATENT DOCUMENTS

| | | | |
|---|---|---|---|
| 2003/0048206 A1* | 3/2003 | Gatherer | H03M 13/6566 341/50 |
| 2004/0213183 A1* | 10/2004 | Barry | H04L 1/0071 370/335 |
| 2006/0169158 A1* | 8/2006 | Koppelkamm | B41F 27/1237 101/415.1 |
| 2009/0113274 A1 | 4/2009 | Lee | |
| 2010/0235712 A1 | 9/2010 | Bhushan | |

(Continued)

FOREIGN PATENT DOCUMENTS

| | | |
|---|---|---|
| CN | 1341295 A | 3/2002 |
| CN | 101075857 A | 11/2007 |

(Continued)

OTHER PUBLICATIONS

Huawei: "Generic interleaver for PDCCH", 3GPP Draft; R1-074226, Oct. 2, 2007 (Oct. 2, 2007), XP050107752, total 9 pages.

(Continued)

*Primary Examiner* — Fritz Alphonse
(74) *Attorney, Agent, or Firm* — Hauptman Ham, LLP

(57) ABSTRACT

The present invention provides channel interleaving method of a polar (Polar) code. The method includes: determining an $M_r$-row and $M_c$-column matrix used for interleaving, and permutating, based on permutation patterns of the column sequence numbers and/or permutation patterns of the row sequence numbers, the matrix into which the to-be-interleaved bits are written. The permutation patterns of the column sequence numbers are represented by: $[P_c(0), P_c(1), \ldots, P_c(i_c), \ldots, P_c(M_c-1)]$. $P_c(i_c)$ is obtained by performing pruned bit reverse (PBR, pruned bit reverse)-based mapping on the column sequence number $i_c$. The permutation patterns of the row sequence numbers are represented by: $[P_r(0), P_r(1), \ldots, P_r(i_r), \ldots, P_r(M_r-1)]$. $P_r(i_r)$ is obtained by performing pruned bit reverse (PBR, pruned bit reverse)-based mapping on the row sequence number $i_r$; and reading interleaved bits from the permutated matrix.

18 Claims, 12 Drawing Sheets

(58) Field of Classification Search
USPC .................................... 714/776, 778, 782
See application file for complete search history.

(56) References Cited

U.S. PATENT DOCUMENTS

| | | | |
|---|---|---|---|
| 2011/0060970 A1 | 3/2011 | Kim et al. | |
| 2015/0236723 A1* | 8/2015 | Dowling | H03M 13/2948 714/755 |
| 2016/0352419 A1* | 12/2016 | Fonseka | H03M 13/2775 |
| 2016/0353362 A1* | 12/2016 | Mackenzie | H04W 36/08 |
| 2017/0012740 A1 | 1/2017 | Shen et al. | |

FOREIGN PATENT DOCUMENTS

| | | |
|---|---|---|
| CN | 101237440 A | 8/2008 |
| CN | 101322317 A | 12/2008 |
| CN | 101453292 A | 6/2009 |
| CN | 101860412 A | 10/2010 |
| CN | 103763298 A | 4/2014 |
| CN | 104917587 A | 9/2015 |
| EP | 2214317 A1 | 8/2010 |
| EP | 3113387 A1 | 1/2017 |
| WO | 2008156335 A2 | 12/2008 |
| WO | 2015139297 A1 | 9/2015 |
| WO | 2015143593 A1 | 10/2015 |

OTHER PUBLICATIONS

Qualcomm Incorporated,"Interleaver design for Polar codes",3GPP TSG-RAN WG1 Meeting #89,R1-1708649,May 15-19, 2017,Hangzhou, P. R. China,total 3 pages.

* cited by examiner

CHANNEL INTERLEAVING METHOD AND APPARATUS

CROSS-REFERENCE TO RELATED APPLICATIONS

This application is a continuation of International Application No. PCT/CN2018/093042, filed on Jun. 27, 2018, which claims priority to Chinese Patent Application No. 201710501671.X, filed on Jun. 27, 2017. The disclosures of the aforementioned applications are hereby incorporated by reference in their entireties.

TECHNICAL FIELD

The present invention relates to the field of communications technologies, and in particular, to a channel interleaving method and apparatus.

BACKGROUND

Rapid evolution of wireless communications indicates that a future communications system is to present some new features. Three most typical communication scenarios include enhanced mobile broadband (English full name: enhanced mobile broadband, eMBB for short), massive machine type communication (English full name: Massive Machine Type Communication, mMTC for short), and ultra-reliable and low latency communications (English full name: Ultra Reliable Low Latency Communication, URLLC for short). Requirements of the communication scenarios are to propose a new challenge to an existing LTE technology. Channel encoding, as a most basic radio access technology, is one of important research objects meeting a communication requirement. Currently, a polar (Polar) code is a known channel encoding method that can be strictly proved to "achieve" a channel capacity. The polar code has a great prospect for development and application in the future communications system.

In higher order modulation and a fading (fading) channel, an interleaving operation is performed after polar code encoding is performed at a transmit end, and a deinterleaving operation needs to be performed at a receive end. Interleaving achieves an effect of disturbing an original data sequence and implementing data randomization. Through interleaving and deinterleaving, discretization of a burst error is implemented, so that the burst error is within an error correction range of an error correction encoder, and impact of a burst error of data is reduced, to improve a channel error correction capability, and further improve anti-interference performance. Therefore, during polar code encoding, an interleaving method needs to be provided, to ensure data randomization.

SUMMARY

Embodiments of the present invention provide a channel interleaving method of a polar code. The interleaving method provides interleaving performance.

According to an aspect, an embodiment of the present invention provides a channel interleaving method of a polar code, including: determining an $M_r$-row and $M_c$-column matrix used for interleaving, where column sequence numbers of the matrix are represented by: $[0, 1, \ldots, i_c, \ldots, M_c-1]$, where $i_c$ is greater than or equal to 0, and is less than or equal to $M_c-1$; and row sequence numbers of the matrix are represented by: $[0, 1, \ldots, i_r, \ldots, M_r-1]$, where it is greater than or equal to 0, and is less than or equal to $M_r-1$; writing to-be-interleaved bits into the matrix; and permutating, based on permutation patterns of the column sequence numbers and/or permutation patterns of the row sequence numbers, the matrix into which the to-be-interleaved bits are written, where the permutation patterns of the column sequence numbers are represented by: $[P_c(0), P_c(1), \ldots, P_c(i_c), \ldots, P_c(M_c-1)]$, where $P_c(i_c)$ is obtained by performing pruned bit reverse (PBR, pruned bit reverse)-based mapping on the column sequence number $i_c$; and the permutation patterns of the row sequence numbers are represented by: $[P_r(0), P_r(1), \ldots, P_r(i_r), \ldots, P_r(M_r-1)]$, where $P_r(i_r)$ is obtained by performing pruned bit reverse (PBR, pruned bit reverse)-based mapping on the row sequence number $i_r$; and reading interleaved bits from the permutated matrix.

According to a second aspect, an embodiment of the present invention provides a channel interleaving method of a polar code, including: determining an $M_r$-row and $M_c$-column matrix used for interleaving, where column sequence numbers of the matrix are represented by: $[0, 1, \ldots, i_c, \ldots, M_c-1]$, where $i_c$ is greater than or equal to 0, and is less than or equal to $M_c-1$; and row sequence numbers of the matrix are represented by: $[0, 1, \ldots, i_r, \ldots, M_r-1]$, where $i_r$ is greater than or equal to 0, and is less than or equal to $M_r-1$; writing to-be-interleaved bits into the matrix; and reading, in an order of permutation patterns of the column sequence numbers and/or permutation patterns of the row sequence numbers, interleaved bits from the matrix into which the to-be-interleaved bits are written, where the permutation patterns of the column sequence numbers are represented by: $[P_c(0), P_c(1), \ldots, P_c(i_c), \ldots, P_c(M_c-1)]$, where $P_c(i_c)$ is obtained by performing pruned bit reverse (PBR, pruned bit reverse)-based mapping on the column sequence number $i_c$; and the permutation patterns of the row sequence numbers are represented by: $[P_r(0), P_r(1), \ldots, P_r(i_r), \ldots, P_r(M_r-1)]$, where $P_r(i_r)$ is obtained by performing pruned bit reverse (PBR, prune bit reverse)-based mapping on the row sequence number $i_r$.

According to a third aspect, an embodiment of the present invention provides a channel interleaving method of a polar code, including: determining an $M_r$-row and $M_c$-column matrix used for interleaving, where column sequence numbers of the matrix are represented by: $[0, 1, \ldots, i_c, \ldots, M_c-1]$, where $i_c$ is greater than or equal to 0, and is less than or equal to $M_c-1$; and row sequence numbers of the matrix are represented by: $[0, 1, \ldots, i_r, \ldots, M_r-1]$, where $i_r$ is greater than or equal to 0, and is less than or equal to $M_r-1$; writing to-be-interleaved bits into the matrix in an order of permutation patterns of the column sequence numbers and/or permutation patterns of the row sequence numbers, where the permutation patterns of the column sequence numbers are represented by: $[P_c(0), P_c(1), \ldots, P_c(i_c), \ldots, P_c(M_c-1)]$, where $P_c(i_c)$ is obtained by performing pruned bit reverse (PBR, pruned bit reverse)-based mapping on the column sequence number $i_c$; and the permutation patterns of the row sequence numbers are represented by: $[P_r(0), P_r(1), \ldots, P_r(i_r), \ldots, P_r(M_r-1)]$, where $P_r(i_r)$ is obtained by performing pruned bit reverse (PBR, pruned bit reverse)-based mapping on the row sequence number $i_r$; and reading interleaved bits from the matrix into which the to-be-interleaved bits are written.

According to a fourth aspect, an embodiment of the present invention provides a channel interleaving method of a polar code, including: determining an $M_c * M_r$ matrix used for interleaving; writing to-be-interleaved bits into the matrix; and reading interleaved bits from the matrix.

According to a fifth aspect, an embodiment of the present invention provides a communications apparatus, including: a determining module, configured to determine an $M_{\_r}$-row and $M_{\_c}$-column matrix used for interleaving, where column sequence numbers of the matrix are represented by: $[0, 1, \ldots, i_c, \ldots, M_{\_c}-1]$, where $i_c$ is greater than or equal to 0, and is less than or equal to $M_{\_c}-1$; and row sequence numbers of the matrix are represented by: $[0, 1, \ldots, i_r, \ldots, M_{\_r}-1]$, where $i_r$ is greater than or equal to 0, and is less than or equal to $M_{\_r}-1$; a writing module, configured to write to-be-interleaved bits into the matrix; a permutation module, configured to permutate, based on permutation patterns of the column sequence numbers and/or permutation patterns of the row sequence numbers, the matrix into which the to-be-interleaved bits are written, where the permutation patterns of the column sequence numbers are represented by: $[P_c(0), P_c(1), \ldots, P_c(i_c), \ldots, P_c(M_{\_c}-1)]$, where $P_c(i_c)$ is obtained by performing pruned bit reverse (PBR, pruned bit reverse)-based mapping on the column sequence number $i_c$; and the permutation patterns of the row sequence numbers are represented by: $[P_r(0), P_r(1), \ldots, P_r(i_r), \ldots, P_r(M_{\_r}-1)]$, where $P_r(i_r)$ is obtained by performing pruned bit reverse (PBR, pruned bit reverse)-based mapping on the row sequence number $i_r$; and a reading module, configured to read interleaved bits from the permutated matrix.

In some embodiments, in the embodiments of the present invention, the determining an $M_{\_r}$-row and $M_{\_c}$-column matrix used for interleaving includes: obtaining the preset column quantity $M_{\_c}$ corresponding to a bit quantity M of the to-be-interleaved bits; and determining the row quantity $M_{\_r}$ based on a formula $M_{\_r}=\text{ceil}(M/M_{\_c})$; or obtaining the preset row quantity $M_{\_r}$ corresponding to a bit quantity M of the to-be-interleaved bits; and determining the column quantity $M_{\_c}$ based on a formula $M_{\_c}=\text{ceil}(M/M_{\_r})$.

In some embodiments, implementation of the present invention further includes: determining the permutation patterns of the column sequence numbers and/or the permutation patterns of the row sequence numbers.

In some embodiments, the determining the permutation patterns of the column sequence numbers includes: obtaining the permutation patterns of the column sequence numbers corresponding to the preset column quantity $M_{\_c}$; or the determining the permutation patterns of the row sequence numbers includes: obtaining the permutation patterns of the row sequence numbers corresponding to the preset row quantity $M_{\_r}$.

In some embodiments, the determining the permutation patterns of the column sequence numbers and/or the permutation patterns of the row sequence numbers includes: obtaining the permutation patterns of the column sequence numbers and/or the permutation patterns of the row sequence numbers through PBR-based mapping.

In some embodiments, a value of $PBR(i_c, M_{\_c})$ is represented by $P_c(i_c)$, and a value of $PBR(i_r, M_{\_r})$ is represented by $P_r(i_r)$, where $PBR(i, M_{\_})$ includes $PBR(i_c, M_{\_c})$ or $PBR(i_r, M_{\_r})$; $P(i)$ includes $P_c(i_c)$ or $P_r(i_r)$; and $M_{\_}$ includes $M_{\_c}$ or $M_{\_r}$. The PBR-based mapping includes any one of Algorithm 1 to Algorithm 5.

According to a fifth aspect, this application provides a communications apparatus, including a unit for performing the method according to any one of the first aspect to the fourth aspect and the possible implementations. Specifically, the communications device may be a sending device or a receiving device.

The function may be implemented by using hardware, or may be implemented by hardware executing corresponding software. The hardware or the software includes one or more modules corresponding to the foregoing function.

In a possible design, when a part or all of the function is implemented by using the hardware, the communications apparatus includes: an input interface circuit, configured to obtain to-be-interleaved bits; a logic circuit, configured to perform the interleaving method according to any one of the first aspect to the fourth aspect and the possible implementations; and an output interface circuit, configured to read interleaved bits.

In some embodiments, the communications apparatus may be a chip or an integrated circuit.

In a possible design, when a part or all of the function is implemented by using the software, the encoding apparatus includes: a memory, configured to store a program; and a processor, configured to execute the program stored in the memory, where when the program is executed, the encoding apparatus may implement the interleaving method according to any one of the first aspect to the fourth aspect and the possible implementations.

In some embodiments, the memory may be a physically independent unit, or may be integrated with the processor.

In a possible design, when a part or all of the function is implemented by using the software, the communications apparatus includes a processor. A memory configured to store a program is located outside the encoding apparatus. The processor is connected to the memory through a circuit/wire, and is configured to read and execute the program stored in the memory.

In a possible design, when a part or all of the function is implemented by using the software, the communications apparatus includes a processor. A memory configured to store a program is located outside the communications apparatus. The processor is connected to the memory through a circuit/wire, and is configured to read and execute the program stored in the memory.

In the implementation of the present invention, the matrix into which the to-be-interleaved bits are written is permutated by using the permutation patterns of the column sequence numbers and/or the permutation patterns of the row sequence numbers, to increase interleaving randomization, and improve interleaving performance. In addition, implementation is simpler than random interleaving.

DESCRIPTION OF EMBODIMENTS

The following further describes specific embodiments of the present invention in detail with reference to the accompanying drawings.

Figure 1:
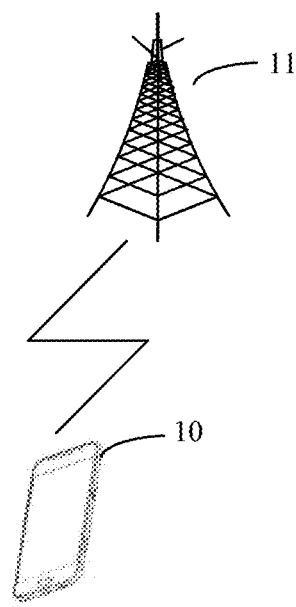
FIG. 1 is a schematic structural diagram of a wireless communications system.

FIG. 1 shows a wireless communications system to which various embodiments are applicable. The wireless communications system may include at least one network device. The network device communicates with one or more terminals. The network device may be a base station, or may be a device integrated by a base station and a base station controller, or may be another device having a similar communication function.

It should be noted that the wireless communications system mentioned in various embodiments includes, but is not limited to: a narrowband Internet of things system (English: Narrow Band-Internet of Things, NB-IoT for short), a global system for mobile communications (English: Global System for Mobile Communications, GSM for short), an enhanced data rates for GSM evolution system (English: Enhanced Data rate for GSM Evolution, EDGE for short), a wideband code division multiple access system (English: Wideband Code Division Multiple Access, WCDMA for short), a code division multiple access 2000 system (English: Code Division Multiple Access, CDMA2000 for short), a time division-synchronous code division multiple access system (English: Time Division-Synchronization Code Division Multiple Access, TD-SCDMA for short), a long term evolution system (English: Long Term Evolution, LTE for short), three major application scenarios, namely, eMBB, URLLC, and eMTC, of a next generation 5G mobile communications system, or a new communications system that emerges in the future.

The terminal in various embodiments may include various handheld devices, vehicle-mounted devices, wearable devices, or computing devices that have a wireless communication function, or another processing device connected to a wireless modem. The terminal may be an MS (English: Mobile Station), a subscriber unit (English: subscriber unit), a cellular phone (English: cellular phone), a smartphone (English: smartphone), a wireless data card, a personal digital assistant (English: Personal Digital Assistant, PDA for short) computer, a tablet computer, a wireless modem (English: modem), a handset (English: handset), a laptop computer (English: laptop computer), a machine type communication (English: Machine Type Communication, MTC for short) terminal, or the like.

Figure 2:
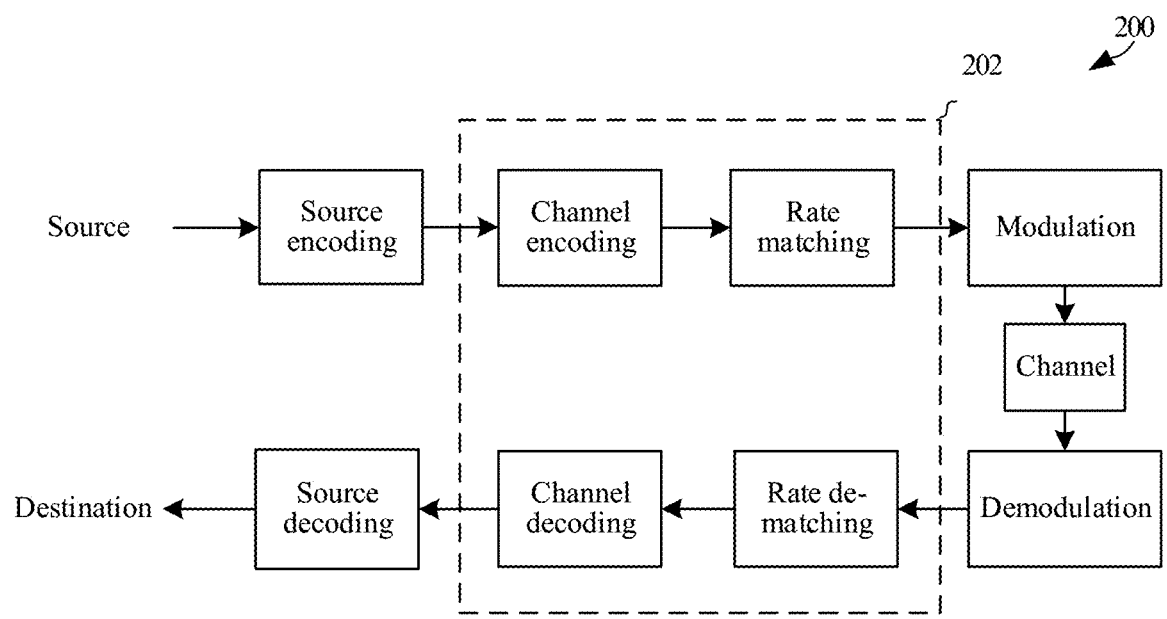
FIG. 2 is a schematic structural diagram of communication between a network device and a terminal by using a wireless technology.

The network device and the terminal in FIG. 1 communicate with each other by using a wireless technology. When the network device sends a signal, the network device is a transmit end; and when the network device receives a signal, the network device is a receive end. Similarly, when the terminal sends a signal, the terminal is a transmit end; and when the terminal receives a signal, the terminal is a receive end. FIG. 2 shows a basic procedure of communication by using a wireless technology. A source at a transmit end successively performs source encoding, channel encoding, rate matching, and modulation for sending a signal on a channel. At a receive end, a destination successively performs demodulation, rate de-matching, channel decoding, and source decoding for receiving a signal. At the transmit end, during rate matching, or after rate matching, an interleaving operation may be performed. A channel interleaving operation is performed after a puncturing, shortening (shorten), or repetition operation is performed on bits on which polar code encoding is performed. In other words, the interleaving operation may be performed by a submodule (after the puncturing, shortening (shorten), or repetition operation is performed on the bits on which polar code encoding is performed) in a rate matching module. Alternatively, a channel interleaving operation is performed on bits on which polar code encoding and rate matching are performed. In other words, the interleaving operation is performed in a separate module after a rate matching module. At the receive end, a deinterleaving operation is performed on demodulated bits. Correspondingly, the deinterleaving operation may be performed in a submodule in a rate dematching module, or may be performed in a separate module independent of a rate matching module.

An interleaving process usually includes the following steps: determining a matrix used for interleaving; writing to-be-interleaved bits into the matrix; and reading interleaved bits from the matrix into which the to-be-interleaved bits are written.

Figure 3:
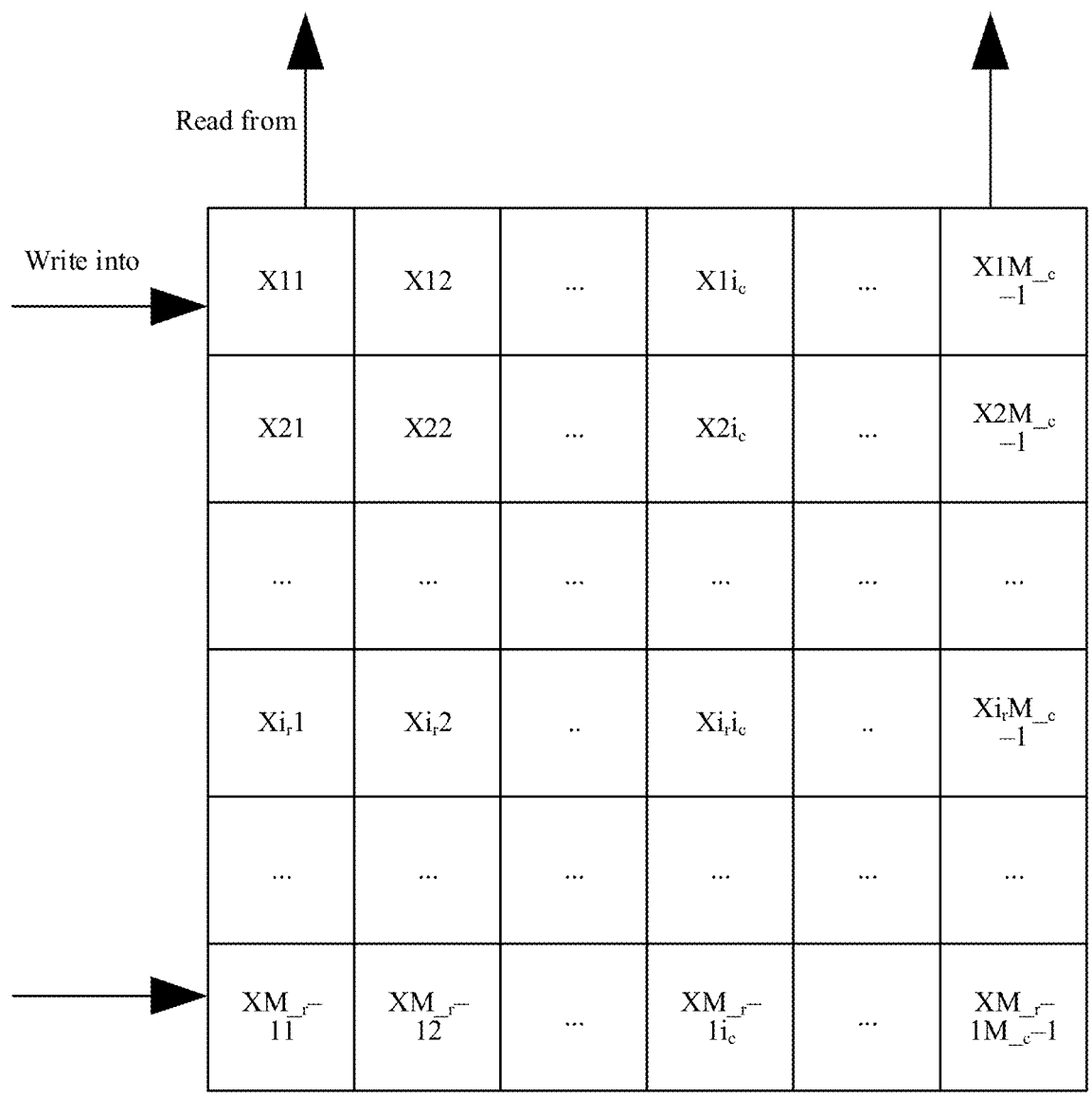
FIG. 3 is a schematic diagram of a matrix according to an embodiment of the present invention.

An example matrix used in various embodiments is an $M_c*M_r$ matrix. The matrix has $M_c$ columns, and the matrix has $M_r$ rows. If column sequence numbers start from 0, the column sequence numbers of the matrix are represented by: $[0, 1, \ldots, i_c, \ldots, M_c-1]$, where $0 \leq i_c \leq M_c-1$. If row sequence numbers start from 0, the row sequence numbers of the matrix are represented by: $[0, 1, \ldots, i_r, M_r-1]$, where $0 \leq i_r \leq M_r-1$. $X_{i_r,i_c}$ represents an element corresponding to a location at an $i_r^{th}$ row and an $i_c^{th}$ column in the matrix, as shown in FIG. 3.

In some embodiments, the row quantity $M_r$ and the column quantity $M_c$ of the matrix used for interleaving may be different. A quantity of to-be-interleaved bits and/or an interleaving depth, and a corresponding row quantity or column quantity may be preset. Quantities of to-be-interleaved bits (which may also be referred to as lengths of an interleaver) in different application scenarios may also be different. The quantities of to-be-interleaved bits may be determined based on the application scenarios, for example, preset column quantities $M_c$ shown in Table 1, (where usually, the interleaving depth refers to a smallest value of a distance that is after interleaving and that is between symbols that are neighboring before interleaving).

TABLE 1

| Interleaving depth | Column quantity $M_c$ (or row quantity $M_r$) | Length of an interleaver |
|---|---|---|
| 28 | 16 | 100 |
| 56 | 32 | 200 |
| 86 | 7 | 300 |
| 112 | 64 | 400 |
| 128 | 16 or 32 or 64 or 125 or 128 or 250 or 256 | 500 |
| 20 | 16 | 72 |
| 40 | 29 or 32 | 144 |
| 80 | 64 | 288 |
| 160 | 128 | 576 |
| 544 | 113 | 1920 |
| 64 | 15 or 30 or 32 or 60 or 64 or 120 or 128 | 240 |
| 128 | 15 or 30 or 32 or 60 or 64 or 120 or 128 or 240 or 256 | 480 |
| 256 | 15 or 30 or 32 or 60 or 64 or 120 or 128 or 240 or 256 or 480 or 512 | 960 |

The second column in Table 1 may also show row quantities $M_r$. In some embodiments, Table 1 may include only the second column and the third column. In some embodiments, Table 1 may include only two columns therein. In some embodiments, Table 1 may include only one or more rows therein. In some embodiments, Table 1 may include only one or more rows therein and include only two columns therein. The values in Table 1 are only an example, or may alternatively be other values.

The column quantity of the matrix used for interleaving may be obtained by looking up Table 1. Then, the row quantity may be determined based on a formula $M_r$=ceil $(M/M_c)$. M is the bit quantity of the to-be-interleaved bits (or an interleaving length).

If the second column in Table 1 shows the row quantities $M_r$, the row quantity of the matrix used for interleaving may be obtained by looking up Table 1. Then, the column quantity may be determined based on a formula $M_c$=ceil $(M/M_r)$. M is the bit quantity of the to-be-interleaved bits (or the interleaving length).

In addition to obtaining, by using Table 1, the column quantity of the matrix used for interleaving, the column quantity or the row quantity of the matrix used for interleaving may be determined by setting the column quantity or the row quantity of the matrix used for interleaving to a prime number. In addition, there are other manners of determining the column quantity (or the row quantity) of the matrix used for interleaving, for example, the row quantity or the column quantity is selected as a prime number. This is not limited herein.

To increase interleaving randomization, an interleaving operation may be performed based on permutation patterns of the column sequence numbers and/or permutation patterns of the row sequence numbers. The interleaving operation may include: writing, in an order of the permutation patterns of the column sequence numbers and/or the permutation patterns of the row sequence numbers, the to-be-interleaved bits into the matrix used for interleaving, or permutating, based on the permutation patterns of the column sequence numbers and/or the permutation patterns of the row sequence numbers, the matrix into which the to-be-interleaved bits are written, or reading, in an order of the permutation patterns of the column sequence numbers and/or the permutation patterns of the row sequence numbers, interleaved bits from the matrix into which the to-be-interleaved bits are written.

The permutation patterns of the column sequence numbers are represented by: $[P_c(0), P_c(1) \ldots, P_c(i_c), \ldots, P_c(M_c-1)]$, where $P_c(i_c)$ is obtained by performing pruned bit reverse (PBR, pruned bit reverse)-based mapping on the column sequence number $i_c$.

The permutation patterns of the row sequence numbers are represented by: $[P_r(0), P_r(1) \ldots, P_r(i_r), \ldots, P_r(M_r-1)]$, where $P_r(i_r)$ is obtained by performing pruned bit reverse (PBR, pruned bit reverse)-based mapping on the row sequence number $i_r$.

There are the following two manners of determining the permutation patterns of the column sequence numbers and/or the permutation patterns of the row sequence numbers.

(1) The permutation patterns of the column sequence numbers are preset and/or the permutation patterns of the row sequence numbers are preset.

The permutation patterns of the column sequence numbers and/or the permutation patterns of the row sequence numbers are determined based on the preset permutation patterns of the column sequence numbers and/or the preset permutation patterns of the row sequence numbers.

(2) The permutation patterns of the column sequence numbers and/or the permutation patterns of the row sequence numbers are determined according to a preset rule.

The permutation patterns of the column sequence numbers are used as an example below to describe the methods for determining the permutation patterns. For methods for determining the permutation patterns of the row sequence numbers, refer to the methods for determining the permutation patterns of the column sequence numbers. For example, the column quantity is replaced with the row quantity, and the column sequence numbers are correspondingly replaced with the row sequence numbers. The methods for determining the permutation patterns of the row sequence numbers are not described herein again.

(1) The Preset Permutation Patterns of the Column Sequence Numbers

The permutation patterns of the column sequence numbers are determined based on the preset permutation patterns of the column sequence numbers. For example, Table 2 shows the preset permutation patterns of the column sequence numbers.

TABLE 2

| Column quantity $M_c$ | Permutation patterns of column sequence numbers $[P_c(0), P_c(1), \ldots, P_c(i_c), \ldots, P_c(M_c - 1)]$ |
|---|---|
| 3 | [0, 2, 1] |
| 4 | [0, 2, 1, 3] |
| 5 | [0, 4, 2, 1, 3] |
| 7 | [0, 4, 2, 6, 1, 5, 3] |
| 8 | [0, 4, 2, 6, 1, 5, 3, 7] |
| 9 | [0, 8, 4, 2, 6, 1, 5, 3, 7] |
| 11 | [0, 8, 4, 2, 10, 6, 1, 9, 5, 3, 7] |
| 13 | [0, 8, 4, 12, 2, 10, 6, 1, 9, 5, 3, 11, 7] |

TABLE 2-continued

| Column quantity $M_{\_c}$ | Permutation patterns of column sequence numbers $[P_c(0), P_c(1), \ldots, P_c(i_c), \ldots, P_c(M_{\_c} - 1)]$ |
|---|---|
| 15 | [0, 8, 4, 12, 2, 10, 6, 14, 1, 9, 5, 13, 3, 11, 7] |
| 16 | [0, 8, 4, 12, 2, 10, 6, 14, 1, 9, 5, 13, 3, 11, 7, 15] |
| 32 | [0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31] |

The first column in Table 2 shows the column quantities $M_{\_c}$, and the second column shows the corresponding permutation patterns of the column sequence numbers. The first column in Table 2 may alternatively show the row quantities $M_{\_r}$, and the corresponding second column shows the corresponding permutation patterns of the column sequence numbers. In some embodiments, Table 2 alternatively includes only one or more rows of values therein. The values in Table 2 are only an example, or may alternatively be other values.

In some embodiments, $P_c(i_c)$ in the preset permutation patterns of the column sequence numbers is obtained by performing pruned bit reverse (PBR, prune bit reverse)-based mapping on the column sequence number $i_c$. For example, $P_c(i_c)$ is obtained by performing pruned bit reverse (PBR, Pruned Bit Reverse)-based mapping with a cyclic shift on the column sequence number $i_c$. In other words, $P_c(i_c)$ is a value of PBR($i_c$, $M_{\_c}$).

For specific meaning of the PBR-based mapping, refer to the following content.

(2) The permutation patterns of the column sequence numbers are determined according to the preset rule.

The column sequence numbers of the matrix are permutated or the permutation patterns of the column sequence number are determined based on pruned bit reverse (PBR, pruned bit reverse)-based mapping. A value of PBR($i_c$, $M_{\_c}$) is represented by $P_c(i_c)$, and a value of PBR($i_r$, $M_{\_r}$) is represented by $P_r(i_r)$, where PBR(i, $M_{\_}$) includes PBR($i_c$, $M_{\_c}$) or PBR($i_r$, $M_{\_r}$); P(i) includes $P_c(i_c)$ or $P_r(i_r)$; and $M_{\_}$ includes $M_{\_c}$ or $M_{\_r}$.

A specific implementation process of the PBR-based mapping may be expressed by Algorithm 1 below:

(1) determining a parameter n of PBR, where n=ceil(log$_2$ ($M_{\_}$));

(2) initialization: i=0, and j=0;

(3) defining x as a decimal digit corresponding to a binary digit obtained through reverse of a binary digit represented by n bits of j;

(4) if x<$M_{\_}$,
P(i)=x; and
i=i+1;

(5) j=j+1; and (6) if (i<$M_{\_}$), performing step (3).

That $M_{\_}$=5 is used as an example below for description:

(1) determining n=ceil(log$_2$5)=3;

(2) initialization: i=0, and j=0;

(3) defining x as a decimal digit corresponding to a binary digit obtained through reverse of a binary digit represented by three bits of j, where values of x are shown in Table 3;

TABLE 3

| j | Binary digit represented by three bits of j | Binary digit obtained through reverse of the binary digit represented by the three bits of j | x |
|---|---|---|---|
| 0 | 000 | 000 | 0 |
| 1 | 001 | 100 | 4 |

TABLE 3-continued

| j | Binary digit represented by three bits of j | Binary digit obtained through reverse of the binary digit represented by the three bits of j | x |
|---|---|---|---|
| 2 | 10 | 10 | 2 |
| 3 | 11 | 110 | 6 |
| 4 | 100 | 001 | 1 |
| 5 | 101 | 101 | 5 |
| 6 | 110 | 11 | 3 |
| 7 | 111 | 111 | 7 |

(4) when x=0, x<3,
P(0)=0;
i=0+1; and (5) j=0+1; and (6) if $i_c$=1<$M_{\_}$,
performing step (4)
. . . .

Based on the foregoing calculation process, values of $P_c(i_c)$ and is are shown in Table 4.

TABLE 4

| j | Binary digit represented by three bits of j | Binary digit obtained through reverse of the binary digit represented by the three bits of j | x | $i_c$ | P(i) |
|---|---|---|---|---|---|
| 0 | 000 | 000 | 0 | 0 | 0 |
| 1 | 001 | 100 | 4 | 1 | 4 |
| 2 | 10 | 10 | 2 | 2 | 2 |
| 3 | 11 | 110 | 6 | | |
| 4 | 100 | 001 | 1 | 3 | 1 |
| 5 | 101 | 101 | 5 | | |
| 6 | 110 | 11 | 3 | 4 | 3 |
| 7 | 111 | 111 | 7 | | |

In some embodiments, the specific implementation process of the PBR-based mapping may alternatively be expressed by Algorithm 2 below:

(1) if $M_{\_}$ is not an integer power of 2, using Algorithm 1; or (2) if $M_{\_}$ is an integer power of 2, in other words, $M_{\_}=2^n$, simplifying PBR(i, $M_{\_}$) as bit reverse (Bit Reverse)-based mapping, where the simplifying specifically includes: (1) representing i by a binary digit represented by n bits; (2) reversing the binary digit to obtain a reversed binary digit; and (3) converting the reversed binary digit into a decimal digit, where the decimal digit is P(i).

In some embodiments, the specific implementation process of the PBR-based mapping may alternatively be expressed by Algorithm 3 below:

(1) determining a parameter n of PBR, where n=ceil(log$_2$ ($M_{\_}$));

(2) determining a decimal digit corresponding to a binary digit obtained through reverse of a binary digit represented by n bits of each element in [0, 1, . . . , $2^n$], to obtain a sequence [$a_0$, $a_1$, . . . , $a_{2^n}$]; and (3) removing (which may also be referred to as pruning) an element whose value is greater than or equal to $M_{\_}$ in [$a_0$, $a_1$, . . . , $a_{2^n}$], to obtain a sequence [P(0), . . . , P($M_{\_}$)].

In some embodiments, the specific implementation process of the PBR-based mapping may alternatively be expressed by Algorithm 4 below:

From a perspective of a PBR generation rule above, for different column quantities (or row quantities), a PBR-based mapping sequence has a nest (nest) feature. In other words, a PBR permutation sequence with smaller M_ is a subset of a PBR permutation sequence with larger M_. During actual application, after determining the column quantity (or the row quantity) of the to-be-interleaved matrix, (1) a maximum value M_Max of a column quantity of each to-be-interleaved matrix is selected, and a maximum value of a parameter $n_{max}$ of PBR is determined, where $n_{max}=\text{ceil}(\log_2(M\_Max))$;

(2) a decimal digit corresponding to a binary digit obtained through reverse of a binary digit represented by $n_{max}$ bits of each element in $[0, 1, \ldots, 2^{n_{max}}]$ is generated or pre-stored (generated), to obtain a sequence $[a_0, a_1, \ldots, a_{2^{n_{max}}}]$; and (3) an element whose value is greater than or equal to M_ in $[a_0, a_1, \ldots, a_{2^{n_{max}}}]$ is removed, to obtain an M_-column sequence $[P(0), \ldots, P(M\_)]$.

In some embodiments, the specific implementation process of the PBR-based mapping may alternatively be expressed by Algorithm 5 below:

mapping obtained by performing pruned bit reverse (PBR, Pruned Bit Reverse)-based mapping with a cyclic shift, for example, obtaining the permutation patterns of the column sequence numbers by PBR permutation of M_ bits with a cyclic shift by t1, where $P(i)=\text{PBR}(\text{mod}(i+t1,M\_),M\_)$, where $i=0,1,2,\ldots,$ or $M\_-1$.

For M_=7, when the cyclic shift t1=3, the permutation patterns of the column sequence numbers are [6, 1, 5, 3, 0, 4, 2]. Cyclic shifts t1 and t2 may be selected based on performance, and are not limited herein.

An interleaving operation is performed based on the permutation patterns of the column sequence numbers and/or the permutation patterns of the row sequence numbers, to increase interleaving randomization.

Based on the foregoing description, the implementation of the present invention is further described with reference to the accompanying drawings.

An embodiment of this application provides an interleaving method of a polar code. The method may be applied to a communications device at a receive end, for example, a network device or a terminal. In the interleaving method in this embodiment, the foregoing matrix is used. For information related to the matrix, refer to the foregoing description. Description of the information is not repeated herein again.

An $M\_c*M\_r$ matrix used for interleaving is determined. The matrix includes $M\_c$ columns, and the matrix includes $M\_r$ rows. The determining a matrix includes: determining the column quantity $M\_c$ and the row quantity $M\_r$. For a method for determining the matrix, refer to the foregoing description. The method for determining the matrix is not repeated herein. To-be-interleaved bits are written into the matrix. For example, the to-be-interleaved bits are written into the matrix in rows or columns. Interleaved bits are read from the matrix. For example, the interleaved bits are read from the matrix in columns, in rows, or in a diagonal or spiral manner.

Embodiment 1

Embodiment 1 provides an interleaving method of a polar code. The method may be applied to a communications device at a receive end, for example, a network device or a terminal. In the interleaving method in this embodiment, to-be-interleaved bits are written, in an order of permutation patterns of column sequence numbers and/or permutation patterns of row sequence numbers, into a matrix used for interleaving. For information related to the matrix in this embodiment, the permutation patterns of the column sequence numbers, and the permutation patterns of the row sequence numbers, refer to the foregoing description. Description of the information is not repeated herein again.

Figure 4:
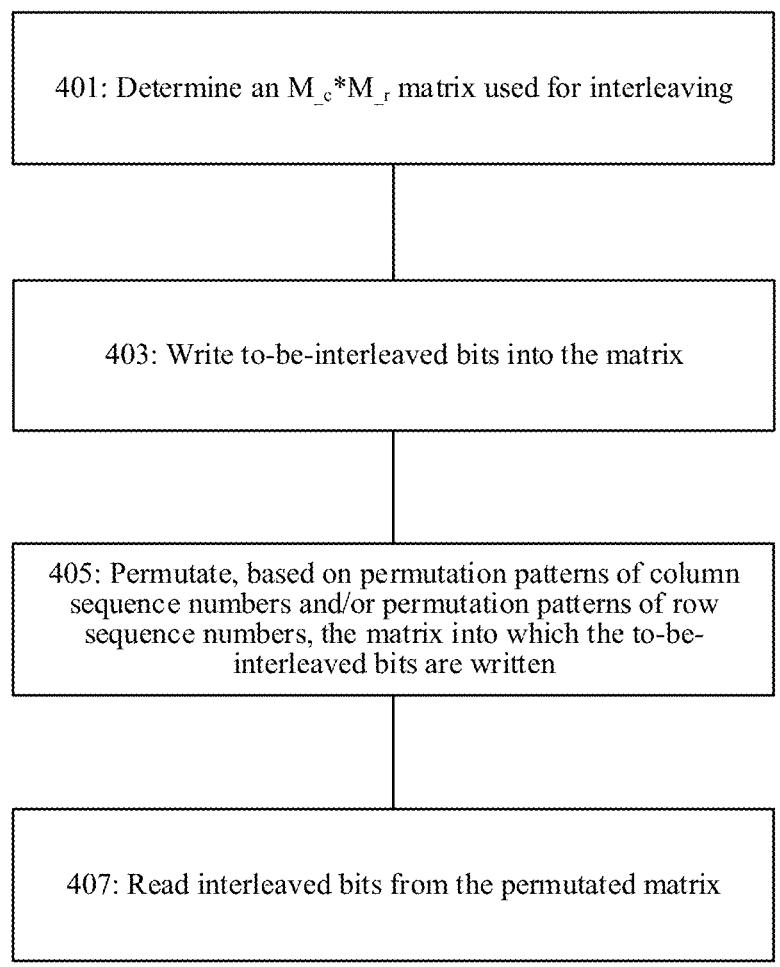
FIG. 4 is a flowchart of an interleaving method according to an embodiment of the present invention.

With reference to FIG. 4, Embodiment 1 is described below.

Step 401: Determine an $M\_c*M\_r$ matrix used for interleaving, where the matrix includes $M\_c$ columns, and the matrix includes $M\_r$ rows.

The determining a matrix includes: determining the column quantity $M\_c$ and the row quantity $M\_r$. For a method for determining the matrix, refer to the foregoing description. The method for determining the matrix is not repeated herein.

Step 403: Write to-be-interleaved bits into the matrix.

The to-be-interleaved bits may be bits on which polar code encoding and rate matching are performed. The to-be-interleaved bits may alternatively be bits obtained by performing a puncturing, shortening (shorten), or repetition operation on bits on which polar code encoding is performed. The to-be-interleaved bits may alternatively be bits obtained from a circular buffer (circular buffer). The to-be-interleaved bits may be represented by: $[m_0, m_1, \ldots, m_k, \ldots, m_{M-1}]$. $K=0, 1, \ldots,$ or $M-1$. M is a bit quantity of the to-be-interleaved bits (or an interleaving length). M is greater than 0.

If the bit quantity M of the to-be-interleaved bits (a length of an interleaver) is less than a product of the row quantity and the column quantity of the matrix, D null (Null) bits may be filled in front of or behind the to-be-interleaved bits, where $M+D=M\_c*M\_r$, and D is greater than or equal to 0. If the null bits are filled in front of the to-be-interleaved bits, the null bits are represented by: $[y_0, y_1, \ldots, y_{D-1}]$; and the to-be-interleaved bits may be expressed by: $y_{D+k}=m_k$. If the null bits are filled behind the to-be-interleaved bits, the to-be-interleaved bits may be expressed by: $y_k=m_k$, and the null bits are represented by: $[y_{0+M}, y_{1+M}, \ldots, y_{D-1+M}]$; and bits $[y_0, y_1, \ldots, y_{D-1+M}]$ are written into the matrix.

The to-be-interleaved bits may be written into the matrix in rows or columns.

If the to-be-interleaved bits are written into the matrix in rows, the to-be-interleaved bits are written into the matrix in an order of [X11, X12, ..., X1$M\_c$-1, X21, X22, ..., X2$M\_c$-1, ..., X$M\_r$-11, X$M\_r$-12, ..., X$M\_r$-1$M\_c$-1].

If the to-be-interleaved bits are written into the matrix in columns, the to-be-interleaved bits are written into the matrix in an order of [X11, X21, ..., X$M\_r$-11, X12, X22, ..., X$M\_r$-12, X1$M\_c$-1, X2$M\_c$-1, ..., X$M\_r$-1$M\_c$-1].

Step 405: Permutate, based on permutation patterns of column sequence numbers and/or permutation patterns of row sequence numbers, the matrix into which the to-be-interleaved bits are written.

For definitions of and a determining method for the permutation patterns of the column sequence numbers and the permutation patterns of the row sequence numbers, refer to the foregoing description. Description of the definitions and the determining method is not repeated herein again.

The permutating, based on permutation patterns of column sequence numbers and/or permutation patterns of row sequence numbers, the matrix into which the to-be-interleaved bits are written includes:

permutating, based on the permutation patterns of the column sequence numbers, the matrix into which the to-be-interleaved bits are written, where to be specific, a $(P_c(i_c))^{th}$ column of a permutated matrix corresponds to an $(i_c)^{th}$ column of the matrix that is not permutated; or permutating, based on the permutation patterns of the row sequence numbers, the matrix into which the to-be-interleaved bits are written, where to be specific, a $(P_r(i_r))^{th}$ row of a permutated matrix corresponds to an $(i_r)^{th}$ column of the matrix that is not permutated; or permutating, based on the permutation patterns of the column sequence numbers and the permutation patterns of the row sequence numbers, the matrix into which the to-be-interleaved bits are written, where to be specific, a $(P_c(i_c))^{th}$ column of a permutated matrix corresponds to an $(i_c)^{th}$ column of the matrix that is not permutated; and a $(P_r(i_r))^{th}$ row of a permutated matrix corresponds to an $(i_r)^{th}$ column of the matrix that is not permutated.

Step 407: Read interleaved bits from the permutated matrix.

If a null (Null) bit is filled before, the null bit needs to be removed, to obtain an encoded bit on which polar code encoding and interleaving are performed.

Figure 5:
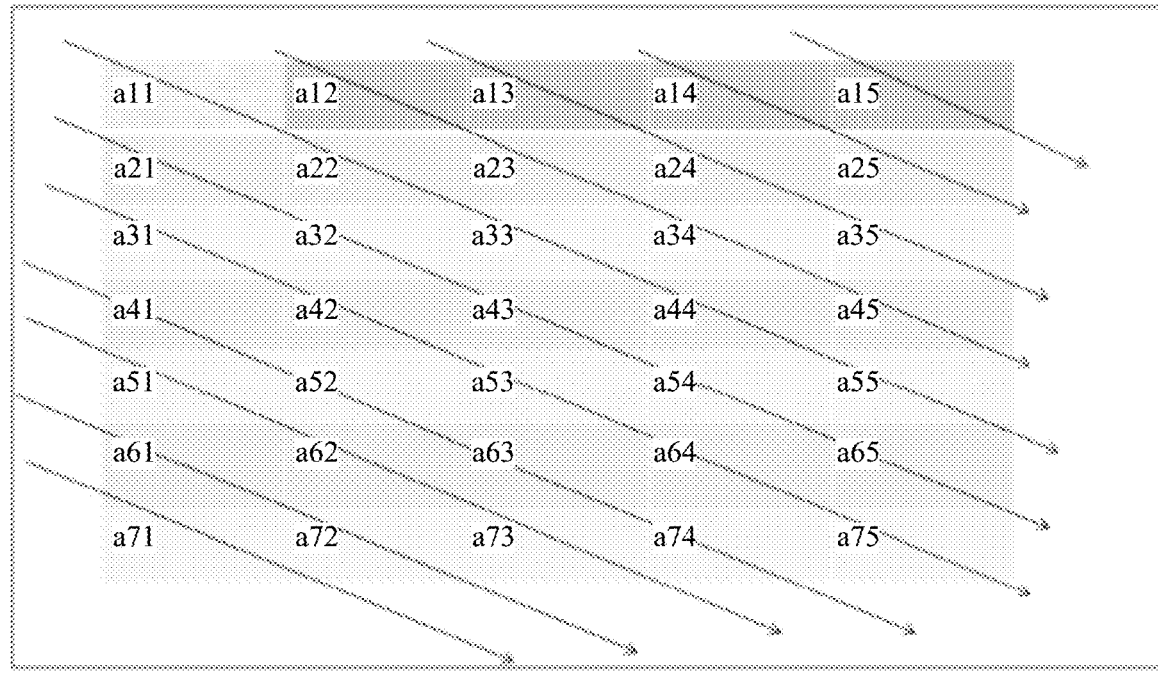
FIG. 5 is a schematic diagram of reading in a diagonal manner according to an embodiment of the present invention.
Figure 6:
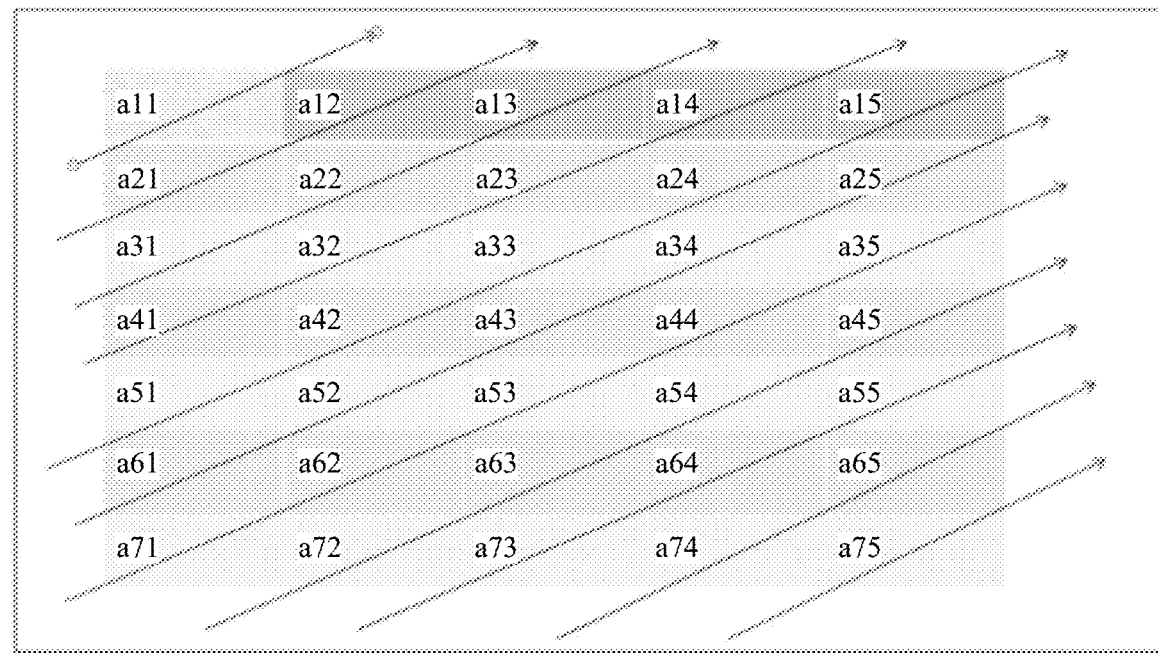
FIG. 6 is a schematic diagram of reading in a spiral manner according to an embodiment of the present invention.

If the to-be-interleaved bits are written into the matrix in rows, the interleaved bits may be read in columns from the permutated matrix; or if the to-be-interleaved bits are written into the matrix in columns, the interleaved bits may be read in rows from the permutated matrix; or the interleaved bits are read in a diagonal manner, as shown in FIG. 5; or the interleaved bits are read in a spiral manner, as shown in FIG. 6.

In the implementation of the present invention, the matrix into which the to-be-interleaved bits are written is permutated by using the permutation patterns of the column sequence numbers and/or the permutation patterns of the row sequence numbers, to increase interleaving randomization, and improve interleaving performance. In addition, implementation is simpler than random interleaving.

Embodiment 2

Embodiment 2 provides an interleaving method of a polar code. The method may be applied to a communications device at a receive end, for example, a network device or a terminal. In the interleaving method in this embodiment, to-be-interleaved bits are written into the matrix in an order of permutation patterns of column sequence numbers and/or permutation patterns of row sequence numbers. For information related to the matrix in this embodiment, the permutation patterns of the column sequence numbers, and the permutation patterns of the row sequence numbers, refer to the foregoing description. Description of the information is not repeated herein again.

Figure 7:
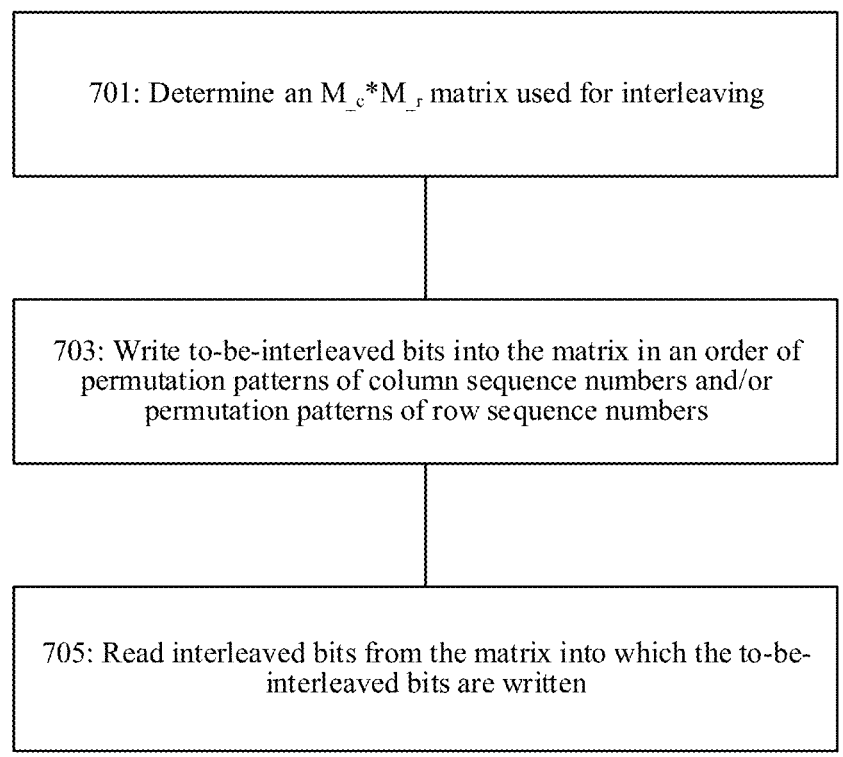
FIG. 7 is a flowchart of an interleaving method according to an embodiment of the present invention.

With reference to FIG. 7, Embodiment 2 is described below.

Step 701: Determine an $M_c*M_r$ matrix used for interleaving, where the matrix includes $M_c$ columns, and the matrix includes $M_r$ rows.

Step 701 is similar to step 401, and is not described again.

Step 703: Write to-be-interleaved bits into the matrix in an order of permutation patterns of column sequence numbers and/or permutation patterns of row sequence numbers.

For the permutation patterns of the column sequence numbers and the permutation patterns of the row sequence numbers, refer to the foregoing description.

The writing to-be-interleaved bits into the matrix in an order of permutation patterns of column sequence numbers and/or permutation patterns of row sequence numbers includes:

writing the to-be-interleaved bits into the matrix based on the permutation patterns of the column sequence numbers, to be specific, writing the to-be-interleaved bits into the matrix in a column order of $[P_c(0), P_c(1), \ldots, P_c(i_c), \ldots, P_c(M_c-1)]$; or writing the to-be-interleaved bits into the matrix in an order of the permutation patterns of the row sequence numbers, to be specific, writing the to-be-interleaved bits into the matrix in a row order of $[P_c(0), [P_r(0), P_r(1), \ldots, P_r(i_r), \ldots, P_r(M_r-1)]$; or writing the to-be-interleaved bits into the matrix in an order of the permutation patterns of the column sequence numbers and the permutation patterns of the row sequence numbers, to be specific, writing the to-be-interleaved bits into the matrix in a column order of $[P_c(0), P_c(1), \ldots, P_c(i_c), \ldots, P_c(M_c-1)]$ and in a row order of $[P_c(0), [P_r(0), P_r(1), \ldots, P_r(i_r), \ldots, P_r(M_r-1)]$.

Step 705: Read interleaved bits from the matrix into which the to-be-interleaved bits are written.

The interleaved bits may be read from the matrix in rows, in columns, or in a diagonal or spiral manner.

In some embodiments, if the to-be-interleaved bits are written into the matrix based on the permutation patterns of the column sequence numbers, the interleaved bits are read, in an order of the permutation patterns of the row sequence numbers, from the matrix into which the to-be-interleaved bits are written; or if the to-be-interleaved bits are written into the matrix based on the permutation patterns of the row sequence numbers, the interleaved bits are read, in an order of the permutation patterns of the column sequence numbers, from the matrix into which the to-be-interleaved bits are written.

Embodiment 2 and Embodiment 1 achieve equivalent effects, interleaving randomization is increased, and interleaving performance is improved. In addition, implementation is simpler than random interleaving.

Embodiment 3

Embodiment 3 provides an interleaving method of a polar code. The method may be applied to a communications device at a receive end, for example, a network device or a terminal. In the interleaving method in this embodiment, to-be-interleaved bits are written into a matrix in an order of permutation patterns of column sequence numbers and/or permutation patterns of row sequence numbers. For information related to the matrix in this embodiment, the permutation patterns of the column sequence numbers, and the permutation patterns of the row sequence numbers, refer to the foregoing description. Description of the information is not repeated herein again.

Figure 8:
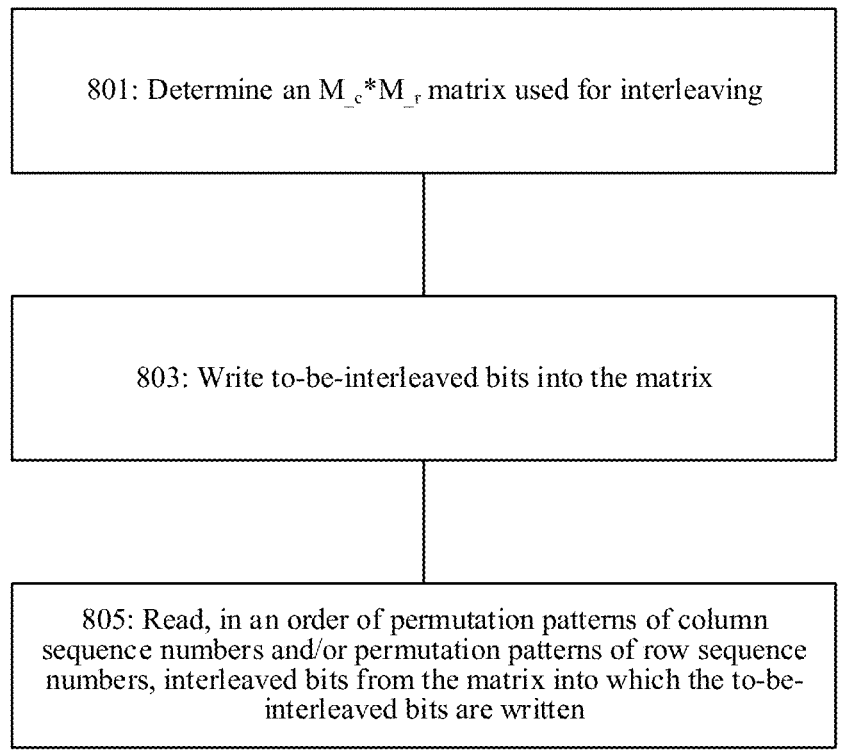
FIG. 8 is a flowchart of an interleaving method according to an embodiment of the present invention.

With reference to FIG. 8, Embodiment 3 is described below.

Step 801: Determine an $M_c*M_r$ matrix used for interleaving, where the matrix includes $M_c$ columns, and the matrix includes $M_r$ rows.

Step 801 is similar to step 401, and is not described again.

Step 803: Write to-be-interleaved bits into the matrix.

Step 803 is similar to step 403 or step 703.

Step 805: Read, in an order of permutation patterns of column sequence numbers and/or permutation patterns of row sequence numbers, interleaved bits from the matrix into which the to-be-interleaved bits are written.

For the permutation patterns of the column sequence numbers and the permutation patterns of the row sequence numbers, refer to the foregoing description.

The reading, in an order of permutation patterns of column sequence numbers and/or permutation patterns of row sequence numbers, interleaved bits from the matrix into which the to-be-interleaved bits are written includes:

reading, in an order of the permutation patterns of the column sequence numbers, the interleaved bits from the matrix into which the to-be-interleaved bits are written, to be specific, reading, in a column order of $[P_c(0), P_c(1), \ldots, P_c(i_c), \ldots, P_c(M_{\_c}-1)]$, the interleaved bits from the matrix into which the to-be-interleaved bits are written; or reading, in an order of the permutation patterns of the row sequence numbers, the interleaved bits from the matrix into which the to-be-interleaved bits are written, to be specific, reading, in a row order of $[P_c(0), [P_r(0), P_r(1), \ldots, P_r(i_r), \ldots, P_r(M_{\_r}-1)]$, the interleaved bits from the matrix into which the to-be-interleaved bits are written; or reading, in an order of the permutation patterns of the column sequence numbers and the permutation patterns of the row sequence numbers, the interleaved bits from the matrix into which the to-be-interleaved bits are written, to be specific, reading, in a column order of $[P_c(0), P_c(1), \ldots, P_c(i_c), \ldots, P_c(M_{\_c}-1)]$ and in a row order of $[P_c(0), [P_r(0), P_r(1), \ldots, P_r(i_r), \ldots, P_r(M_{\_r}-1)]$, the interleaved bits from the matrix into which the to-be-interleaved bits are written.

Embodiment 3, Embodiment 1, and Embodiment 2 achieve equivalent effects, interleaving randomization is increased, and interleaving performance is improved. In addition, implementation is simpler than random interleaving.

Apparatus Part

Figure 9:
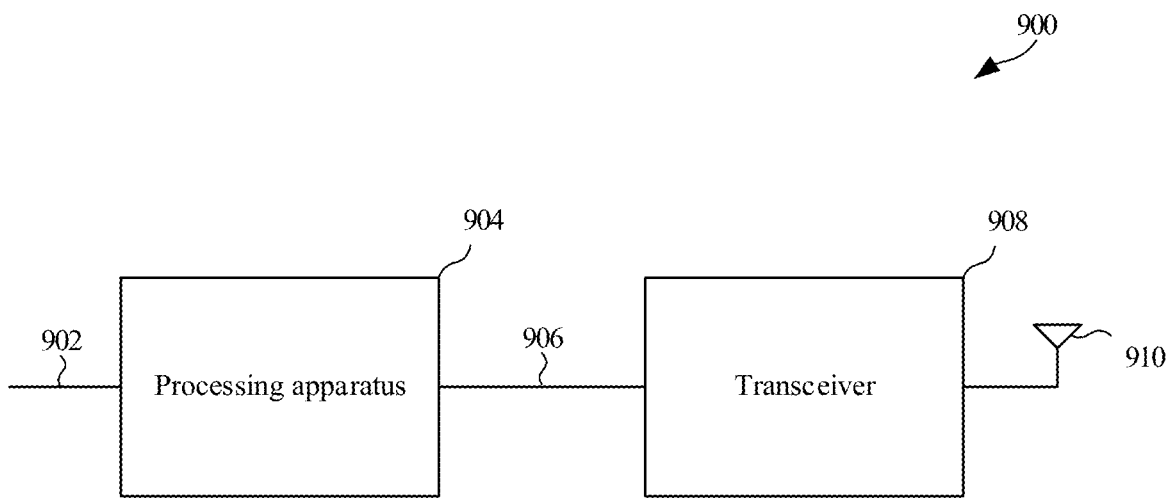
FIG. 9 is a schematic structural diagram of a communications apparatus according to an embodiment of the present invention.

FIG. 9 shows a communications apparatus 900 according to an embodiment of the present invention, to implement an interleaving function. The communications device 900 includes:

a transceiver 908, configured to obtain to-be-interleaved bits; and a processing apparatus 904, configured to determine an $M_{\_r}$-row and $M_{\_c}$-column matrix used for interleaving, where column sequence numbers of the matrix are represented by: $[0, 1, \ldots, i_c, \ldots, M_{\_c}-1]$, where is $i_c$ greater than or equal to 0, and is less than or equal to $M_{\_c}-1$; and row sequence numbers of the matrix are represented by: $[0, 1, \ldots, i_r, \ldots, M_{\_r}-1]$, where $i_r$ is greater than or equal to 0, and is less than or equal to $M_{\_r}-1$; configured to write the to-be-interleaved bits into the matrix; further configured to permutate, based on permutation patterns of the column sequence numbers and/or permutation patterns of the row sequence numbers, the matrix into which the to-be-interleaved bits are written, where the permutation patterns of the column sequence numbers are represented by: $[P_c(0), P_c(1), \ldots, P_c(i_c), \ldots, P_c(M_{\_c}-1)]$, where $P_c(i_c)$ is obtained by performing pruned bit reverse PBR (pruned bit reverse)-based mapping on the column sequence number $i_c$; and the permutation patterns of the row sequence numbers are represented by: $[P_r(0), P_r(1), \ldots, P_r(i_r), \ldots, P_r(M_{\_r}-1)]$, where $P_r(i_r)$ is obtained by performing pruned bit reverse PBR (pruned bit reverse)-based mapping on the row sequence number $i_r$; and configured to read interleaved bits from the permutated matrix.

The processing apparatus 904 is configured to perform the method in Embodiment 1. For related specific description, refer to the description in the foregoing method embodiment. Details are not described herein again. During specific implementation, the foregoing processing apparatus may be a chip or an integrated circuit.

Figure 10:
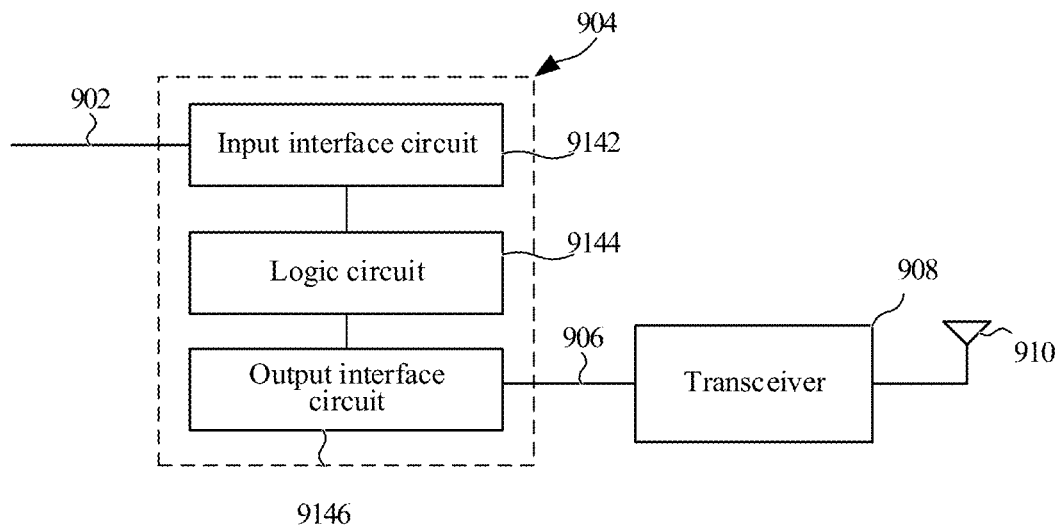
FIG. 10 is a schematic structural diagram of a communications apparatus according to an embodiment of the present invention.

An embodiment of the present invention further provides a processing apparatus for interleaving. The processing apparatus may be implemented by using hardware or may be implemented by using software. When the processing apparatus is implemented by using the hardware, referring to FIG. 10, the processing apparatus includes:

an input interface circuit 9142, configured to obtain to-be-interleaved bits;

a logical unit 9144, configured to: determine an $M_{\_r}$-row and $M_{\_c}$-column matrix used for interleaving, where column sequence numbers of the matrix are represented by: $[0, 1, \ldots, i_c, \ldots, M_{\_c}-1]$, where $i_c$ is greater than or equal to 0, and is less than or equal to $M_{\_c}-1$; and row sequence numbers of the matrix are represented by: $[0, 1, \ldots, i_r, \ldots, M_{\_r}-1]$, where $i_r$ is greater than or equal to 0, and is less than or equal to $M_{\_r}-1$; configured to write the to-be-interleaved bits into the matrix; and further configured to permutate, based on permutation patterns of the column sequence numbers and/or permutation patterns of the row sequence numbers, the matrix into which the to-be-interleaved bits are written, where the permutation patterns of the column sequence numbers are represented by: $[P_c(0), P_c(1), \ldots, P_c(i_c), \ldots, P_c(M_{\_c}-1)]$, where $P_c(i_c)$ is obtained by performing pruned bit reverse PBR (pruned bit reverse)-based mapping on the column sequence number $i_c$; and the permutation patterns of the row sequence numbers are represented by: $[P_r(0), P_r(1), \ldots, P_r(i_r), \ldots, P_r(M_{\_r}-1)]$, where $P_r(i_r)$ is obtained by performing pruned bit reverse PBR (pruned bit reverse)-based mapping on the row sequence number $i_r$; and an input interface circuit 9146, configured to read interleaved bits from the permutated matrix.

The logic circuit 9144 may be configured to perform the interleaving method shown in Embodiment 1. For details, refer to the description in the foregoing method embodiment. Details are not described herein again. During specific implementation, the foregoing processing apparatus may be a chip or an integrated circuit.

Figure 11A:
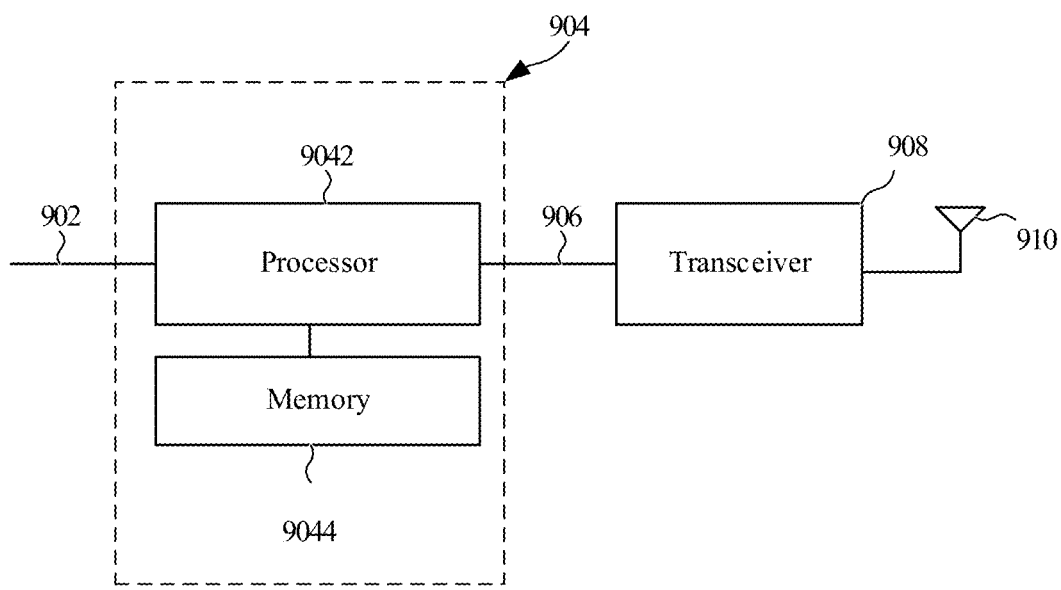
FIG. 11a is a schematic structural diagram of a communications apparatus according to an embodiment of the present invention.
Figure 11B:
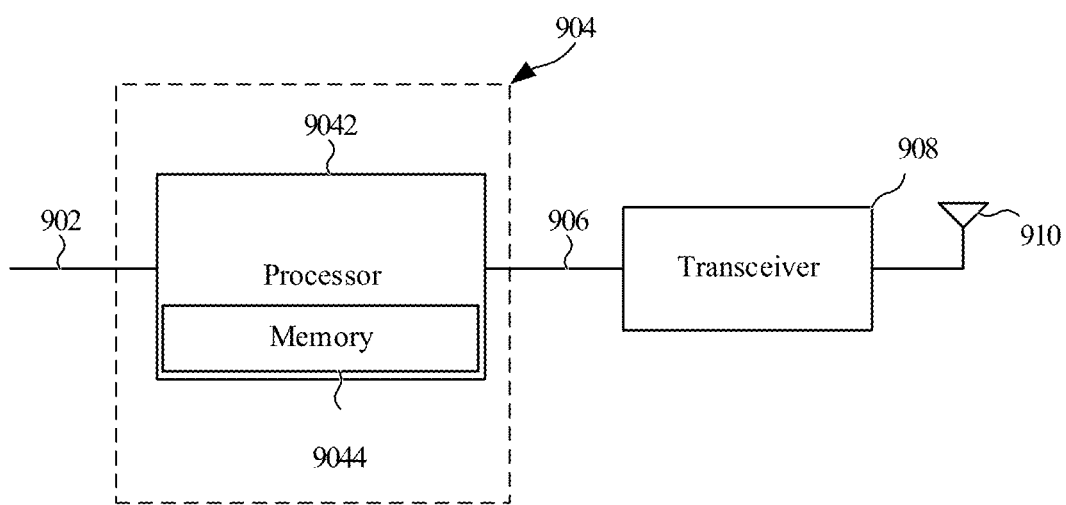
FIG. 11b is a schematic structural diagram of a communications apparatus according to an embodiment of the present invention.

When the processing apparatus is implemented by using the software, referring to FIG. 11a and FIG. 11b, the processing apparatus includes:

a memory 9042, configured to store a program; and a processor 9044, configured to execute the program stored in the memory, where when the program is executed, the memory 9042 may be a physically independent unit, or may be integrated with the processor 9044.

The processor 9042 may be configured to perform the interleaving method shown in Embodiment 1. For details, refer to the description in the foregoing method embodiment. Details are not described herein again.

Figure 12:
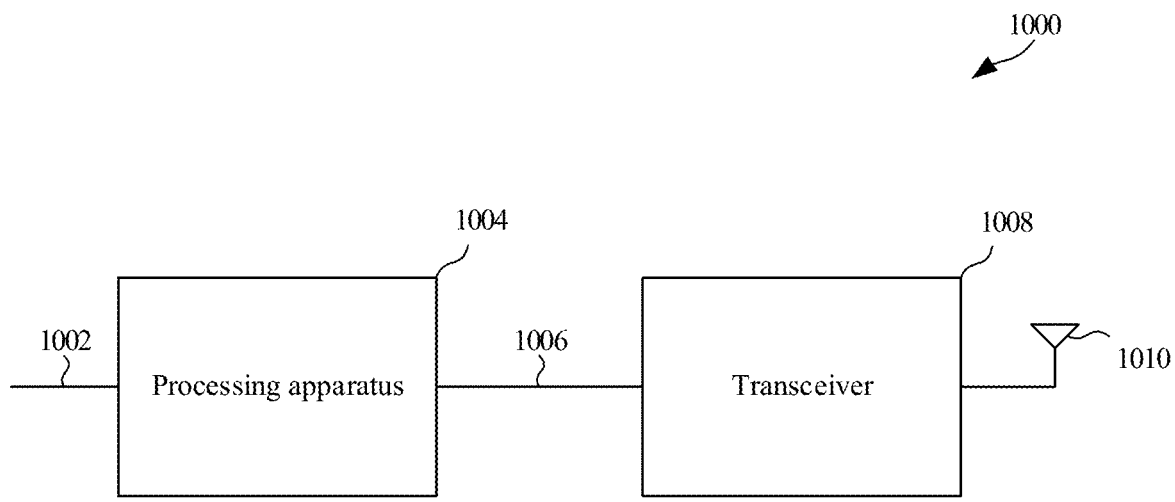
FIG. 12 is a schematic structural diagram of a communications apparatus according to an embodiment of the present invention.

FIG. 12 shows a communications apparatus 1000 according to an embodiment of the present invention, to implement an interleaving function. The communications device 1000 includes:

a transceiver 1008, configured to obtain to-be-interleaved bits; and a processing apparatus 1004, configured to determine an $M_{\_r}$-row and $M_{\_c}$-column matrix used for interleaving, where column sequence numbers of the matrix are represented by: $[0, 1, \ldots, i_c, \ldots, M_{\_c}-1]$, where is $i_c$ greater than or equal to 0, and is less than or equal to $M_{\_c}-1$; and row sequence numbers of the matrix are represented by: $[0, 1, \ldots, i_r, \ldots, M_{\_r}-1]$, where $i_r$ is greater than or equal to 0, and is less than or equal to $M_{\_r}-1$; configured to write the to-be-interleaved bits into the matrix based on permutation patterns of the column sequence numbers and/or permutation patterns of the row sequence numbers, where the permutation patterns of the column sequence numbers are represented by: [$P_c(0)$, $P_c(1)$, ..., $P_c(i_c)$, ..., $P_c(M_{\_c}-1)$], where $P_c(i_c)$ is obtained by performing pruned bit reverse (PBR, pruned bit reverse)-based mapping on the column sequence number $i_c$; and the permutation patterns of the row sequence numbers are represented by: [$P_r(0)$, $P_r(1)$, ..., $P_r(i_r)$, ..., $P_r(M_{\_r}-1)$], where $P_r(i_r)$ is obtained by performing pruned bit reverse (PBR, pruned bit reverse)-based mapping on the row sequence number $i_r$; and configured to read interleaved bits from the matrix into which the to-be-interleaved bits are written.

The processing apparatus 1004 is configured to perform the method in Embodiment 2. For related specific description, refer to the description in the foregoing method embodiment. Details are not described herein again. During specific implementation, the foregoing processing apparatus may be a chip or an integrated circuit.

Figure 13:
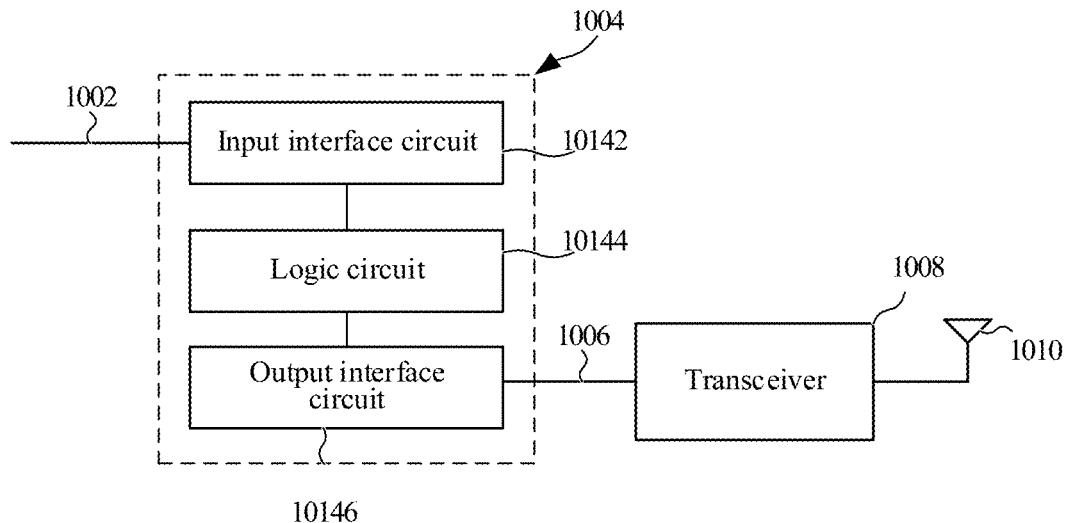
FIG. 13 is a schematic structural diagram of a communications apparatus according to an embodiment of the present invention.

An embodiment further provides a processing apparatus for encoding. The processing apparatus may be implemented by using hardware or may be implemented by using software. When the processing apparatus is implemented by using the hardware, referring to FIG. 13, the processing apparatus includes:

an input interface circuit 10142, configured to obtain to-be-interleaved bits;

a logical unit 10144, configured to determine an $M_{\_r}$-row and $M_{\_c}$-column matrix used for interleaving, where column sequence numbers of the matrix are represented by: [0, 1, ..., $i_c$, ..., $M_{\_c}-1$], where $i_c$ is greater than or equal to 0, and is less than or equal to $M_{\_c}-1$; and row sequence numbers of the matrix are represented by: [0, 1, ..., $i_r$, ..., $M_{\_r}-1$], where $i_r$ is greater than or equal to 0, and is less than or equal to $M_{\_r}-1$; and configured to write the to-be-interleaved bits into the matrix based on permutation patterns of the column sequence numbers and/or permutation patterns of the row sequence numbers, where the permutation patterns of the column sequence numbers are represented by: [$P_c(0)$, $P_c(1)$, ..., $P_c(i_c)$, ..., $P_c(M_{\_c}-1)$], where $P_c(i_c)$ is obtained by performing pruned bit reverse (PBR, pruned bit reverse)-based mapping on the column sequence number $i_c$; and the permutation patterns of the row sequence numbers are represented by: [$P_r(0)$, $P_r(1)$, ..., $P_r(i_r)$, ..., $P_r(M_{\_r}-1)$], where $P_r(i_r)$ is obtained by performing pruned bit reverse (PBR, pruned bit reverse)-based mapping on the row sequence number $i_r$; and an input interface circuit 10146, configured to read interleaved bits from the matrix into which the to-be-interleaved bits are written.

The logic circuit 10144 may be configured to perform the interleaving method shown in Embodiment 2. For details, refer to the description in the foregoing method embodiment. Details are not described herein again. During specific implementation, the foregoing processing apparatus may be a chip or an integrated circuit.

Figure 14A:
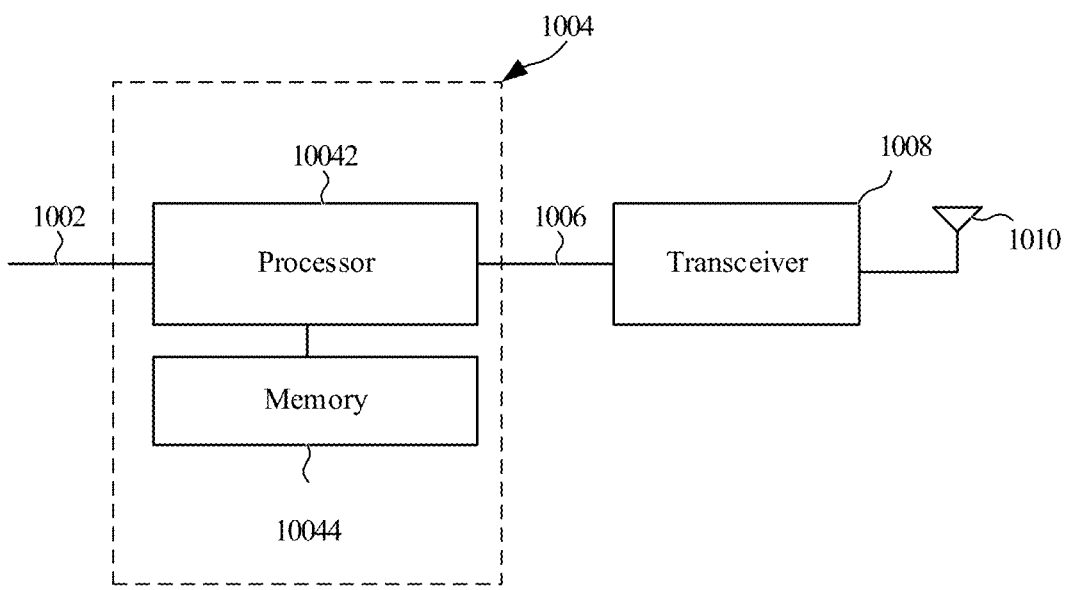
FIG. 14a is a schematic structural diagram of a communications apparatus according to an embodiment of the present invention.
Figure 14B:
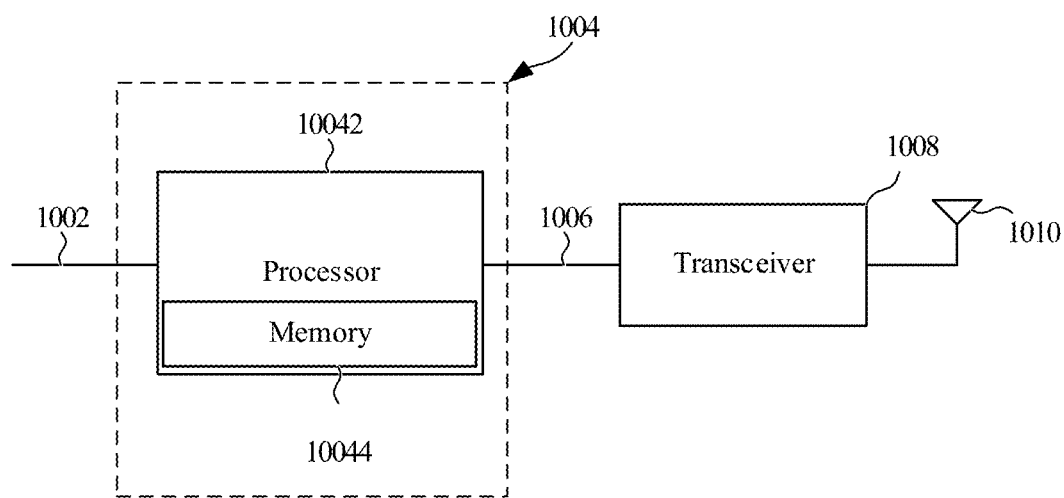
FIG. 14b is a schematic structural diagram of a communications apparatus according to an embodiment of the present invention.

When the processing apparatus is implemented by using the software, referring to FIG. 14a and FIG. 14b, the processing apparatus includes:

a memory 10042, configured to store a program; and a processor 10044, configured to execute the program stored in the memory, where when the program is executed, the memory 10042 may be a physically independent unit, or may be integrated with the processor 10044.

The processor 10042 may be configured to perform the interleaving method shown in Embodiment 2. For details, refer to the description in the foregoing method embodiment. Details are not described herein again.

Figure 15:
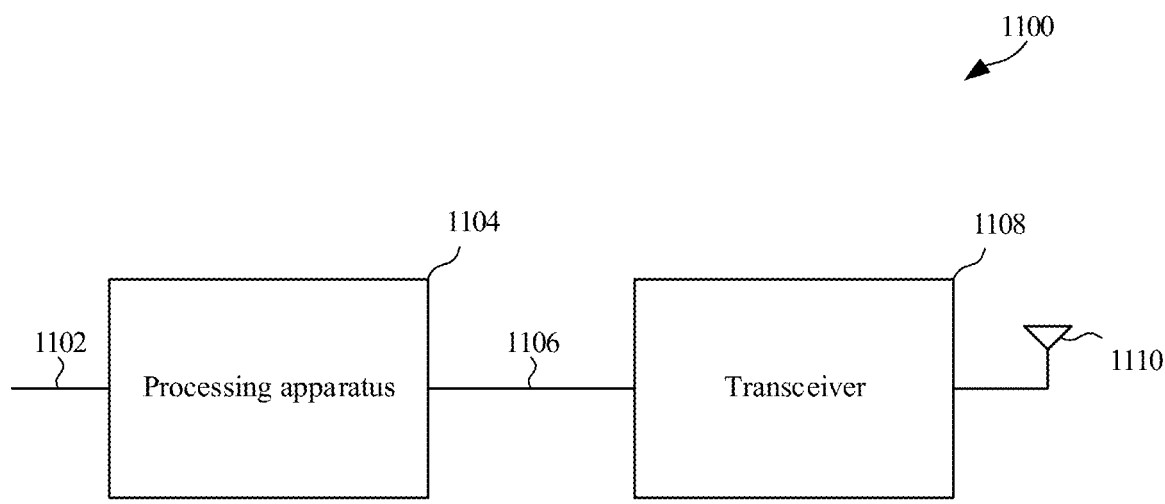
FIG. 15 is a schematic structural diagram of a communications apparatus according to an embodiment of the present invention.

FIG. 15 shows a communications apparatus 1100 according to an embodiment of the present invention, to implement an interleaving function. The communications device 1100 includes:

a transceiver 1108, configured to obtain to-be-interleaved bits; and a processing apparatus 1104, configured to determine an $M_{\_r}$-row and $M_{\_c}$-column matrix used for interleaving, where column sequence numbers of the matrix are represented by: [0, 1, ..., $i_c$, ..., $M_{\_c}-1$], where $i_c$ is greater than or equal to 0, and is less than or equal to $M_{\_c}-1$; and row sequence numbers of the matrix are represented by: [0, 1, ..., $i_r$, ..., $M_{\_r}-1$], where $i_r$ is greater than or equal to 0, and is less than or equal to $M_{\_r}-1$; configured to write the to-be-interleaved bits into the matrix; and configured to read, in an order of permutation patterns of the column sequence numbers and/or permutation patterns of the row sequence numbers, interleaved bits from the matrix into which the to-be-interleaved bits are written, where the permutation patterns of the column sequence numbers are represented by: [$P_c(0)$, $P_c(1)$, ..., $P_c(i_c)$, ..., $P_c(M_{\_c}-1)$], where $P_c(i_c)$ is obtained by performing pruned bit reverse (PBR, pruned bit reverse)-based mapping on the column sequence number $i_c$; and the permutation patterns of the row sequence numbers are represented by: [$P_r(0)$, $P_r(1)$, ..., $P_r(i_r)$, ..., $P_r(M_{\_r}-1)$], where $P_r(i_r)$ is obtained by performing pruned bit reverse (PBR, pruned bit reverse)-based mapping on the row sequence number $i_r$.

The processing apparatus 1104 is configured to perform the method in Embodiment 3. For related specific description, refer to the description in the foregoing method embodiment. Details are not described herein again. During specific implementation, the foregoing processing apparatus may be a chip or an integrated circuit.

Figure 16:
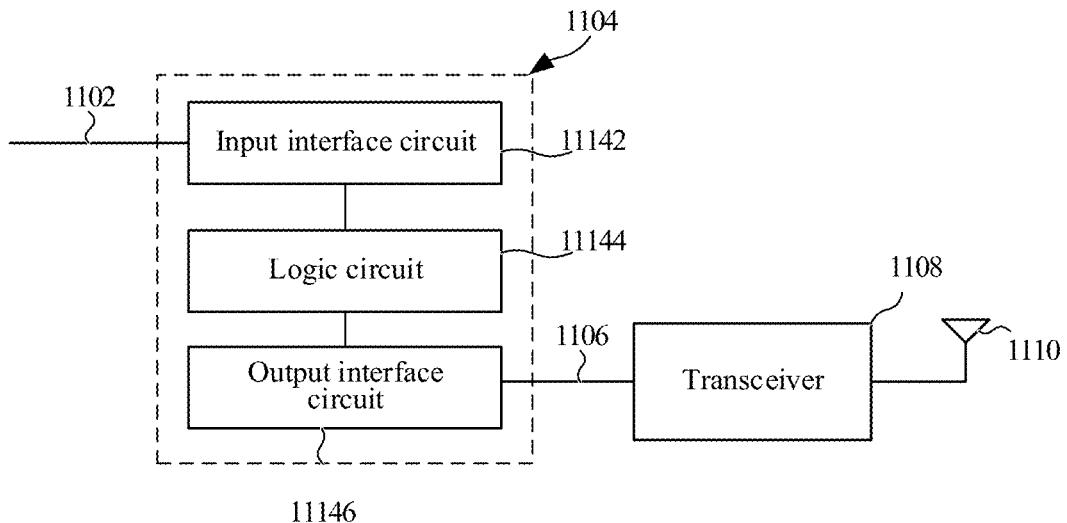
FIG. 16 is a schematic structural diagram of a communications apparatus according to an embodiment of the present invention.

An embodiment of the present invention further provides a processing apparatus for encoding. The processing apparatus may be implemented by using hardware or may be implemented by using software. When the processing apparatus is implemented by using the hardware, referring to FIG. 16, the processing apparatus includes:

an input interface circuit 11142, configured to obtain to-be-interleaved bits;

a logical unit 11144, configured to: determine an $M_{\_r}$-row and $M_{\_c}$-column matrix used for interleaving, where column sequence numbers of the matrix are represented by: [0, 1, ..., $i_c$, ..., $M_{\_c}-1$], where $i_c$ is greater than or equal to 0, and is less than or equal to $M_{\_c}-1$; and row sequence numbers of the matrix are represented by: [0, 1, ..., $i_r$, ..., $M_{\_r}-1$], where it is greater than or equal to 0, and is less than or equal to $M_{\_r}-1$; and configured to write the to-be-interleaved bits into the matrix; and an input interface circuit 11146, configured to read, in an order of permutation patterns of the column sequence numbers and/or permutation patterns of the row sequence numbers, interleaved bits from the matrix into which the to-be-interleaved bits are written, where the permutation patterns of the column sequence numbers are represented by: [$P_c(0)$, $P_c(1)$, ..., $P_c(i_c)$, ..., $P_c(M_{\_c}-1)$], where $P_c(i_c)$ is obtained by performing pruned bit reverse (PBR, pruned bit reverse)-based mapping on the column sequence number $i_c$; and the permutation patterns of the row sequence numbers are represented by: [$P_r(0)$, $P_r(1)$, ..., $P_r(i_r)$, ..., $P_r(M_{\_r}-1)$], where $P_r(i_r)$ is obtained by performing pruned bit reverse (PBR, pruned bit reverse)-based mapping on the row sequence number $i_r$.

The logic circuit 11144 may be configured to perform the interleaving method shown in Embodiment 3. For details, refer to the description in the foregoing method embodiment. Details are not described herein again. During specific implementation, the foregoing processing apparatus may be a chip or an integrated circuit.

Figure 17A:
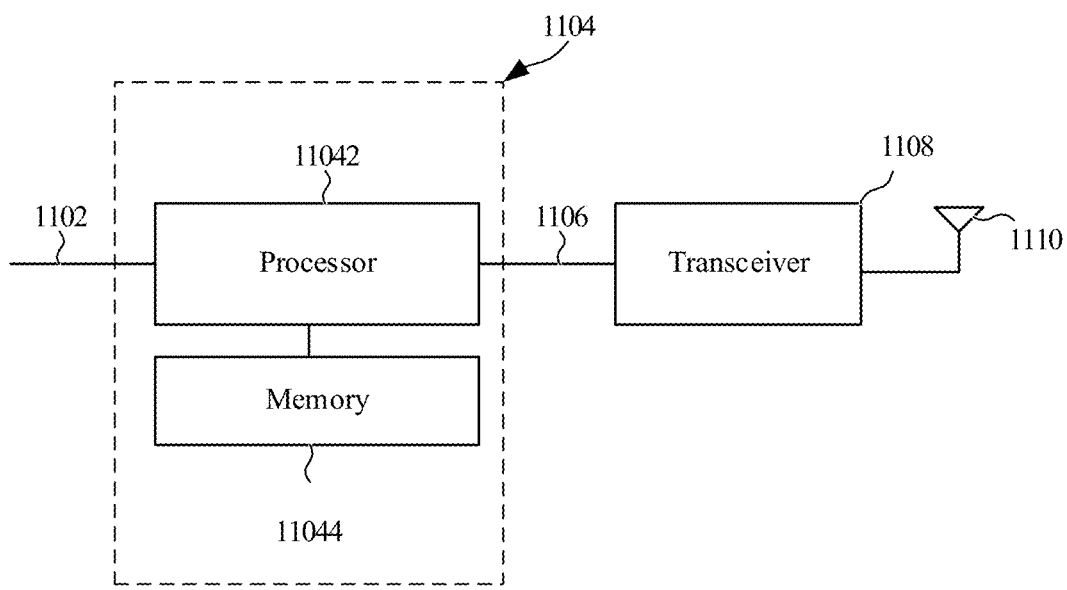
FIG. 17a is a schematic structural diagram of a communications apparatus according to an embodiment of the present invention.
Figure 17B:
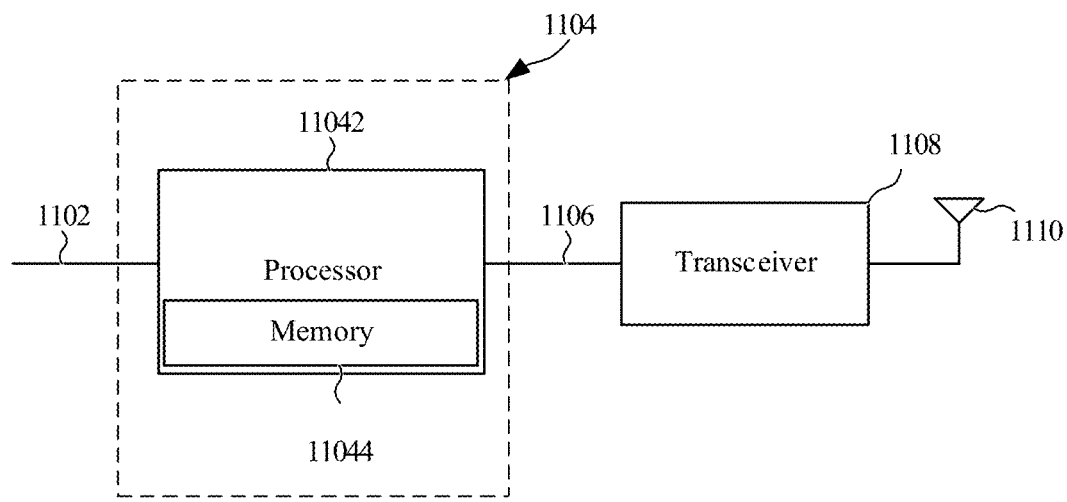
FIG. 17b is a schematic structural diagram of a communications apparatus according to an embodiment of the present invention.

When the processing apparatus is implemented by using the software, referring to FIG. 17a and FIG. 17b, the processing apparatus includes:

a memory 11042, configured to store a program; and a processor 11044, configured to execute the program stored in the memory, where when the program is executed, the memory 11042 may be a physically independent unit, or may be integrated with the processor 10044.

The processor 11042 may be configured to perform the interleaving method shown in Embodiment 3. For details, refer to the description in the foregoing method embodiment. Details are not described herein again.

Figure 18:
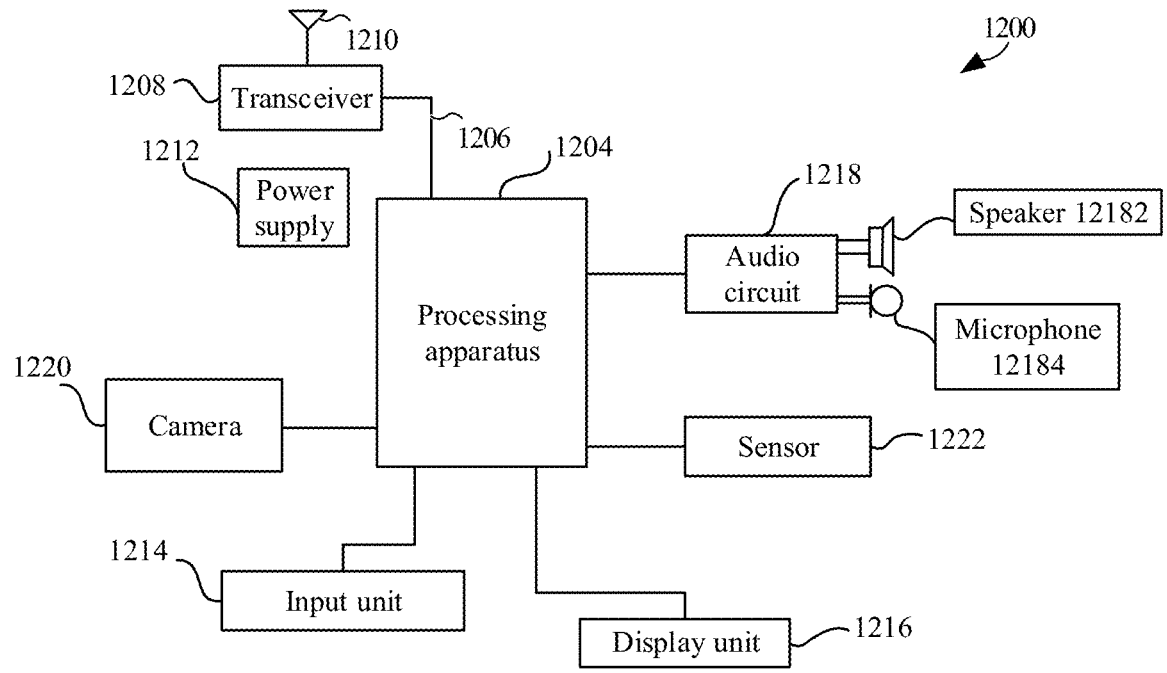
FIG. 18 is a schematic structural diagram of a communications apparatus according to an embodiment of the present invention.

The communications device may be a terminal, or may be a network device. When the communications device is a terminal, referring to FIG. 18, the terminal may further include a power supply 1212, configured to provide various components or circuits in the terminal with a power source; and the terminal may further include an antenna 1210, configured to send, through a radio signal, uplink data output by a transceiver, or output a received radio signal to a transceiver.

In addition, to make a function of the terminal more perfect, the terminal may further include one or more of an input unit 1214, a display unit 1216, an audio circuit 1218, a camera 1220, and a sensor 1222. The audio circuit may include a speaker 12182, a microphone 12184, or the like.

Implementation of the present invention further provides another communications apparatus, including:

a determining module, configured to determine an $M_{\_r}$-row and $M_{\_c}$-column matrix used for interleaving, where column sequence numbers of the matrix are represented by: $[0, 1, \ldots, i_c, \ldots, M_{\_c}-1]$, where $i_c$ is greater than or equal to 0, and is less than or equal to $M_{\_c}-1$; and row sequence numbers of the matrix are represented by: $[0, 1, \ldots, i_r, \ldots, M_{\_r}-1]$, where $i_r$ is greater than or equal to 0, and is less than or equal to $M_{\_r}-1$; a writing module, configured to write to-be-interleaved bits into the matrix; a permutation module, configured to permutate, based on permutation patterns of the column sequence numbers and/or permutation patterns of the row sequence numbers, the matrix into which the to-be-interleaved bits are written, where the permutation patterns of the column sequence numbers are represented by: $[P_c(0), P_c(1), \ldots, P_c(i_c), \ldots, P_c(M_{\_c}-1)]$, where $P_c(i_c)$ is obtained by performing pruned bit reverse (PBR, pruned bit reverse)-based mapping on the column sequence number $i_c$; and the permutation patterns of the row sequence numbers are represented by: $[P_r(0), P_r(1), \ldots, P_r(i_r), \ldots, P_r(M_{\_r}-1)]$, where $P_r(i_r)$ is obtained by performing pruned bit reverse (PBR, pruned bit reverse)-based mapping on the row sequence number $i_r$; and a reading module, configured to read interleaved bits from the permutated matrix.

Implementation of the present invention further provides another communications apparatus, including:

a determining module 1004, configured to determine an $M_{\_r}$-row and $M_{\_c}$-column matrix used for interleaving, where column sequence numbers of the matrix are represented by: $[0, 1, \ldots, i_c, \ldots, M_{\_c}-1]$, where $i_c$ is greater than or equal to 0, and is less than or equal to $M_{\_c}-1$; and row sequence numbers of the matrix are represented by: $[0, 1, \ldots, i_r, \ldots, M_{\_r}-1]$, where $i_r$ is greater than or equal to 0, and is less than or equal to $M_{\_r}-1$; a writing module, configured to write to-be-interleaved bits into the matrix based on permutation patterns of the column sequence numbers and/or permutation patterns of the row sequence numbers, where the permutation patterns of the column sequence numbers are represented by: $[P_c(0), P_c(1), \ldots, P_c(i_c), \ldots, P_c(M_{\_c}-1)]$, where $P_c(i_c)$ is obtained by performing pruned bit reverse (PBR, pruned bit reverse)-based mapping on the column sequence number $i_c$; and the permutation patterns of the row sequence numbers are represented by: $[P_r(0), P_r(1), \ldots, P_r(i_r), \ldots, P_r(M_{\_r}-1)]$, where $P_r(i_r)$ is obtained by performing pruned bit reverse (PBR, pruned bit reverse)-based mapping on the row sequence number $i_r$; and a reading module, configured to read interleaved bits from the matrix into which the to-be-interleaved bits are written.

Implementation of the present invention further provides another communications apparatus, including:

a determining module, configured to determine an $M_{\_r}$-row and $M_{\_c}$-column matrix used for interleaving, where column sequence numbers of the matrix are represented by: $[0, 1, \ldots, i_c, \ldots, M_{\_c}-1]$, where $i_c$ is greater than or equal to 0, and is less than or equal to $M_{\_c}-1$; and row sequence numbers of the matrix are represented by: $[0, 1, \ldots, i_r, \ldots, M_{\_r}-1]$, where $i_r$ is greater than or equal to 0, and is less than or equal to $M_{\_r}-1$; a writing module, configured to write to-be-interleaved bits into the matrix; and a reading module, configured to read, in an order of permutation patterns of the column sequence numbers and/or permutation patterns of the row sequence numbers, interleaved bits from the matrix into which the to-be-interleaved bits are written, where the permutation patterns of the column sequence numbers are represented by: $[P_c(0), P_c(1), \ldots, P_c(i_c), \ldots, P_c(M_{\_c}-1)]$, where $P_c(i_c)$ is obtained by performing pruned bit reverse (PBR, pruned bit reverse)-based mapping on the column sequence number $i_c$; and the permutation patterns of the row sequence numbers are represented by: $[P_r(0), P_r(1), \ldots, P_r(i_r), \ldots, P_r(M_{\_r}-1)]$, where $P_r(i_r)$ is obtained by performing pruned bit reverse (PBR, pruned bit reverse)-based mapping on the row sequence number $i_r$.

In some embodiments, the determining module in the foregoing embodiment is configured to: obtain preset $M_{\_c}$ corresponding to a bit quantity M of the to-be-interleaved bits; and determine $M_{\_r}$ based on a formula $M_{\_r}=\text{ceil}(M/M_{\_c})$; or configured to: obtain preset $M_{\_r}$ corresponding to a bit quantity M of the to-be-interleaved bits; and determine $M_{\_c}$ based on a formula $M_{\_c}=\text{ceil}(M/M_{\_r})$.

For preset $M_{\_c}$ corresponding to the bit quantity M of the to-be-interleaved bits, refer to the foregoing description. Description of $M_{\_c}$ is not repeated herein again.

In some embodiments, the determining module is configured to determine the permutation patterns of the column sequence numbers and/or the permutation patterns of the row sequence numbers.

In some embodiments, the determining module is configured to obtain the permutation patterns of the column sequence numbers corresponding to preset $M_{\_c}$; or configured to obtain the permutation patterns of the row sequence numbers corresponding to preset $M_{\_r}$.

For the permutation patterns of the column sequence numbers corresponding to preset $M_{\_c}$, refer to the foregoing description. Description of the permutation patterns is not repeated herein again.

In some embodiments, the determining module is configured to obtain the permutation patterns of the column sequence numbers and/or the permutation patterns of the row sequence numbers through PBR-based mapping.

For the PBR-based mapping, refer to the foregoing description. Description of the PBR-based mapping is not repeated herein again.

With reference to the foregoing descriptions, a person skilled in the art may be aware that the methods in the embodiments of the specification may be implemented by using hardware (for example, a logic circuit), or software, or a combination of hardware and software. Whether the methods are performed by using the hardware or the software depends on particular applications and design constraint conditions of the technical solutions. A person skilled in the art may use different methods to implement the described functions for each particular application, but it should not be considered that the implementation goes beyond the scope of this application.

When the functions are implemented in a form of software and sold or used as an independent product, the functions may be stored in a computer-readable storage medium. In this case, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in various embodiments. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A channel interleaving method of a polar (Polar) code, the method being performed by a receive end device, wherein the receive end device comprising a processing apparatus configured to perform the method, and the method comprising:

determining an $M_r$-row and $M_c$-column matrix used for interleaving, wherein column sequence numbers of the matrix are represented by: $[0, 1, \ldots, i_c, \ldots, M_c-1]$, wherein $i_c$ is greater than or equal to 0, and is less than or equal to $M_c-1$; and row sequence numbers of the matrix are represented by: $[0, 1, \ldots, i_r, \ldots, M_r-1]$, wherein $i_r$ is greater than or equal to 0, and is less than or equal to $M_r-1$;

writing to-be-interleaved bits into the matrix; and permutating, based on permutation patterns of the column sequence numbers and/or permutation patterns of the row sequence numbers, the matrix into which the to-be-interleaved bits are written, wherein the permutation patterns of the column sequence numbers are represented by: $[P_c(0), P_c(1), \ldots, P_c(i_c), \ldots, P_c(M_c-1)]$, wherein $P_c(i_c)$ is obtained by performing pruned bit reverse (PBR, pruned bit reverse))based mapping on column sequence number $i_c$; and the permutation patterns of the row sequence numbers are represented by: $[P_r(0), P_r(1), \ldots, P_r(i_r), \ldots, P_r(M_r-1)]$, wherein $P_r(i_r)$ is obtained by performing pruned bit reverse (PBR, pruned bit reverse)—based mapping on row sequence number $i_r$; and reading interleaved bits from the permutated matrix.

2. The method according to claim 1, wherein determining the $M_r$-row and $M_c$-column matrix used for interleaving comprises:

obtaining a preset column quantity $M_c$ corresponding to a bit quantity M of the to-be-interleaved bits; and determining a row quantity $M_r$ based on a formula $M_r=\text{ceil}(M/M_c)$; and determining the column quantity $M_c$ based on a formula $M_c=\text{ceil}(M/M_r)$.

3. The method according to claim 2, wherein the preset column quantity $M_c$ or row quantity $M_r$ corresponding to the bit quantity M of the to-be-interleaved bits comprises one of at least one of the following rows:

| Column quantity $M_c$ or row quantity $M_r$ | Length of an interleaver |
|---|---|
| 16 | 100 |
| 32 | 200 |
| 7 | 300 |
| 64 | 400 |
| 16 or 32 or 64 or 125 or 128 or 250 or 256 | 500 |
| 16 | 72 |
| 29 or 32 | 144 |
| 64 | 288 |
| 128 | 576 |
| 113 | 1920 |
| 15 or 30 or 32 or 60 or 64 or 120 or 128 | 240 |
| 15 or 30 or 32 or 60 or 64 or 120 or 128 or 240 or 256 | 480 |
| 15 or 30 or 32 or 60 or 64 or 120 or 128 or 240 or 256 or 480 or 512. | 960 |

4. The method according to claim 1, wherein determining the $M_r$-row and $M_c$-column matrix used for interleaving comprises:

obtaining a preset column quantity $M_c$ corresponding to a bit quantity M of the to-be-interleaved bits;

obtaining a preset row quantity $M_r$ corresponding to a bit quantity M of the to-be-interleaved bits; and determining the preset column quantity $M_c$ based on a formula $M_c=\text{ceil}(M/M_r)$.

5. The method according to claim 1, wherein the method further comprises: determining the permutation patterns of the column sequence numbers and/or the permutation patterns of the row sequence numbers.

6. The method according to claim 5, wherein determining the permutation patterns of the column sequence numbers comprises:

obtaining the permutation patterns of the column sequence numbers corresponding to a preset column quantity $M_c$; or obtaining the permutation patterns of the row sequence numbers corresponding to a preset row quantity $M_r$.

7. The method according to claim 6, wherein the permutation patterns of the column sequence numbers corresponding to the preset column quantity $M_c$ or the permutation patterns of the row sequence numbers corresponding to the preset row quantity $M_r$ comprise at least one of the following rows:

| Column quantity $M_{\_c}$ (or row quantity $M_{\_r}$) | Permutation patterns of column (or row) sequence numbers $[P_c(0), P_c(1), \ldots, P_c(i_c), \ldots, P_c(M_{\_c} - 1)]$ |
|---|---|
| 3 | [0, 2, 1] |
| 4 | [0, 2, 1, 3] |
| 5 | [0, 4, 2, 1, 3] |
| 7 | [0, 4, 2, 6, 1, 5, 3] |
| 8 | [0, 4, 2, 6, 1, 5, 3, 7] |
| 9 | [0, 8, 4, 2, 6, 1, 5, 3, 7] |
| 11 | [0, 8, 4, 2, 10, 6, 1, 9, 5, 3, 7] |
| 13 | [0, 8, 4, 12, 2, 10, 6, 1, 9, 5, 3, 11, 7] |
| 15 | [0, 8, 4, 12, 2, 10, 6, 14, 1, 9, 5, 13, 3, 11, 7] |
| 16 | [0, 8, 4, 12, 2, 10, 6, 14, 1, 9, 5, 13, 3, 11, 7, 15] |
| 32 | [0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31]. |

8. The method according to claim 5, wherein the determining the permutation patterns of the column sequence numbers and/or the permutation patterns of the row sequence numbers comprises: obtaining the permutation patterns of the column sequence numbers and/or the permutation patterns of the row sequence numbers through PBR-based mapping.

9. The method according to claim 8, wherein a value of $PBR(i_c, M_{\_c})$ is represented by $P_c(i_c)$, and a value of $PBR(i_r, M_{\_r})$ is represented by $P_r(i_r)$, wherein $PBR(i, M_{\_})$ comprises $PBR(i_c, M_{\_c})$ or $PBR(i_r, M_{\_r})$; $P(i)$ comprises $P_c(i_c)$ or $P_r(i_r)$; and M comprises $M_{\_c}$ or $M_{\_r}$; and the PBR-based mapping comprises at least one of the following algorithms:

Algorithm 1:
(1) determining a parameter n of PBR, wherein n=ceil($\log_2(M_{\_})$);
(2) initialization: i=0, and j=0;
(3) defining x as a decimal digit corresponding to a binary digit obtained through reverse of a binary digit represented by n bits of j;
(4) if x<$M_{\_}$,
P(i)=x; and
i=i+1;
(5) j=j+1; and
(6) if (i<$M_{\_}$), performing step (3);

Algorithm 2:
if $M_{\_}$ is not an integer power of 2, using Algorithm 1; or
if $M_{\_}$ is an integer power of 2, in other words, M=$2^n$, simplifying $PBR(i, M_{\_})$ as bit reverse (Bit Reverse)-based mapping, wherein the simplifying comprises: (a) representing i by a binary digit represented by n bits; (b) reversing the binary digit to obtain a reversed binary digit; and (c) converting the reversed binary digit into a decimal digit, wherein the decimal digit is P(i);

Algorithm 3:
(i) determining a parameter n of PBR, wherein n=ceil($\log_2(M_{\_})$);
(ii) determining a decimal digit corresponding to a binary digit obtained through reverse of a binary digit represented by n bits of each element in [0, 1, ..., $2^n$], to obtain a sequence [$a_0, a_1, \ldots, a_{2^n}$]; and
(iii) removing (which may also be referred to as pruning) an element whose value is greater than or equal to $M_{\_}$ in [$a_0, a_1, \ldots, a_{2^n}$], to obtain a sequence [P(0), ..., P($M_{\_}$)];

Algorithm 4:
(*) determining a maximum value M_Max of a column quantity of each to-be-interleaved matrix, and determining a maximum value of a parameter $n_{max}$ of PBR, wherein $n_{max}$=ceil($\log_2(M\_Max)$);
(**) generating or pre-storing (generating) a decimal digit corresponding to a binary digit obtained through reverse of a binary digit represented by $n_{max}$ bits of each element in [0, 1, ..., $2^{n_{max}}$], to obtain a sequence [$a_0, a_1, \ldots, a_{2^{n_{max}}}$]; and
(***) removing an element whose value is greater than or equal to $M_{\_}$ in [$a_0, a_1, \ldots, a_{2^{n_{max}}}$], to obtain an $M_{\_}$-column sequence [P(0), ..., P($M_{\_}$)]; and Algorithm 5:
obtaining the permutation patterns of the column sequence numbers through PBR permutation of $M_{\_}$ bits with a cyclic shift by t1, wherein
P(i)=PBR(mod(i+t1, $M_{\_}$), $M_{\_}$), wherein i=0, 1, 2, ..., or $M_{\_}$−1.

10. A communications apparatus, comprising a processor configured to execute program modules including:
a determining module, configured to determine an $M_{\_r}$-row and $M_{\_c}$-column matrix used for interleaving, wherein
column sequence numbers of the matrix are represented by: [0, 1, ..., $i_c$, ..., $M_{\_c}$−1], wherein $i_c$ is greater than or equal to 0, and is less than or equal to $M_{\_c}$−1; and
row sequence numbers of the matrix are represented by: [0, 1, ..., $i_r$, ..., $M_{\_r}$−1], wherein it is greater than or equal to 0, and is less than or equal to $M_{\_r}$−1;
a writing module, configured to write to-be-interleaved bits into the matrix;
a permutation module, configured to permutate, based on permutation patterns of the column sequence numbers and/or permutation patterns of the row sequence numbers, the matrix into which the to-be-interleaved bits are written, wherein
the permutation patterns of the column sequence numbers are represented by: [$P_c(0), P_c(1), \ldots, P_c(i_c), \ldots, P_c(M_{\_c}−1)$], wherein $P_c(i_c)$ is obtained by performing pruned bit reverse (PBR, pruned bit reverse)-based mapping on column sequence number $i_c$; and
the permutation patterns of the row sequence numbers are represented by: [$P_r(0), P_r(1), \ldots, P_r(i_r), \ldots, P_r(M_{\_r}−1)$], wherein $P_r(i_r)$ is obtained by performing pruned bit reverse (PBR, pruned bit reverse)-based mapping on row sequence number $i_r$; and
a reading module, configured to read interleaved bits from the permutated matrix.

11. The apparatus according to claim 10, wherein the determining module is configured to: obtain a preset column quantity $M_{\_c}$ corresponding to a bit quantity M of the to-be-interleaved bits; and determine a row quantity $M_{\_r}$ based on a formula $M_{\_r}$=ceil(M/$M_{\_c}$); or configured to: obtain a preset row quantity $M_{\_r}$ corresponding to a bit quantity M of the to-be-interleaved bits; and determine a column quantity $M_{\_c}$ based on a formula $M_{\_c}$=ceil(M/$M_{\_r}$).

12. The apparatus according to claim 11, wherein the preset column quantity $M_{\_c}$ or row quantity M r corresponding to the bit quantity M of the to-be-interleaved bits comprises one of at least one of the following rows:

| Column quantity $M_{\_c}$ or row quantity $M_{\_r}$ | Length of an interleaver |
|---|---|
| 16 | 100 |
| 32 | 200 |
| 7 | 300 |
| 64 | 400 |

-continued

| Column quantity $M_{\_c}$ or row quantity $M_{\_r}$ | Length of an interleaver |
|---|---|
| 16 or 32 or 64 or 125 or 128 or 250 or 256 | 500 |
| 16 | 72 |
| 29 or 32 | 144 |
| 64 | 288 |
| 128 | 576 |
| 113 | 1920 |
| 15 or 30 or 32 or 60 or 64 or 120 or 128 | 240 |
| 15 or 30 or 32 or 60 or 64 or 120 or 128 or 240 or 256 | 480 |
| 15 or 30 or 32 or 60 or 64 or 120 or 128 or 240 or 256 or 480 or 512. | 960 |

13. The apparatus according to claim 10, wherein the determining module is configured to determine the permutation patterns of the column sequence numbers and/or the permutation patterns of the row sequence numbers.

14. The apparatus according to claim 13, wherein the determining module is configured to
 obtain the permutation patterns of the column sequence numbers corresponding to the preset column quantity $M_{\_c}$; or
 obtain the permutation patterns of the row sequence numbers corresponding to a preset row quantity $M_{\_r}$.

15. The apparatus according to claim 14, wherein the permutation patterns of the column sequence numbers corresponding to the preset column quantity $M_{\_c}$ comprise at least one of the following rows:

| Column quantity $M_{\_c}$ (or row quantity $M_{\_r}$) | Permutation patterns of column (or row) sequence numbers $[P_c(0), P_c(1), \ldots, P_c(i_c), \ldots, P_c(M_{\_c} - 1)]$ |
|---|---|
| 3 | [0, 2, 1] |
| 4 | [0, 2, 1, 3] |
| 5 | [0, 4, 2, 1, 3] |
| 7 | [0, 4, 2, 6, 1, 5, 3] |
| 8 | [0, 4, 2, 6, 1, 5, 3, 7] |
| 9 | [0, 8, 4, 2, 6, 1, 5, 3, 7] |
| 11 | [0, 8, 4, 2, 10, 6, 1, 9, 5, 3, 7] |
| 13 | [0, 8, 4, 12, 2, 10, 6, 1, 9, 5, 3, 11, 7] |
| 15 | [0, 8, 4, 12, 2, 10, 6, 14, 1, 9, 5, 13, 3, 11, 7] |
| 16 | [0, 8, 4, 12, 2, 10, 6, 14, 1, 9, 5, 13, 3, 11, 7, 15] |
| 32 | [0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31]. |

16. The apparatus according to claim 13, wherein the determining module is configured to obtain the permutation patterns of the column sequence numbers and/or the permutation patterns of the row sequence numbers through PBR-based mapping.

17. The apparatus according to claim 16, wherein a value of $PBR(i_c, M_{\_c})$ is represented by $P_c(i_c)$, and a value of $PBR(i_r, M_{\_r})$ is represented by $P_r(i_r)$, wherein $PBR(i, M_{\_})$ comprises $PBR(i_c, M_{\_c})$ or $PBR(i_r, M_{\_r})$; $P(i)$ comprises $P_c(i_c)$ or $P_r(i_r)$; and M comprises $M_{\_c}$ or $M_{\_r}$; and
 the PBR-based mapping comprises at least one of the following algorithms:

Algorithm 1:
(1) determining a parameter n of PBR, wherein n=ceil($\log_2(M_{\_})$);
(2) initialization: i=0, and j=0;
(3) defining x as a decimal digit corresponding to a binary digit obtained through reverse of a binary digit represented by n bits of j;
(4) if x<$M_{\_}$,
P(i)=x; and
i=i+1;
(5) j=j+1; and
(6) if (i<$M_{\_}$), performing step (3);

Algorithm 2:
if $M_{\_}$ is not an integer power of 2, using Algorithm 1; or
if $M_{\_}$ is an integer power of 2, in other words, M=$2^n$, simplifying $PBR(i, M_{\_})$ as bit reverse (Bit Reverse)-based mapping, wherein the simplifying specifically comprises: (a) representing i by a binary digit represented by n bits; (b) reversing the binary digit to obtain a reversed binary digit; and (c) converting the reversed binary digit into a decimal digit, wherein the decimal digit is P(i);

Algorithm 3:
(i) determining a parameter n of PBR, wherein n=ceil($\log_2(M_{\_})$);
(ii) determining a decimal digit corresponding to a binary digit obtained through reverse of a binary digit represented by n bits of each element in [0, 1, ..., $2^n$], to obtain a sequence $[a_0, a_1, \ldots, a_{2^n}]$; and
(iii) removing (which may also be referred to as pruning) an element whose value is greater than or equal to $M_{\_}$ in $[a_0, a_1, \ldots, a_{2^n}]$, to obtain a sequence $[P(0), \ldots, P(M_{\_})]$;

Algorithm 4:
(*) determining a maximum value M_Max of a column quantity of each to-be-interleaved matrix, and determining a maximum value of a parameter $n_{max}$ of PBR, wherein $n_{max}$=ceil($\log_2$(M_Max));
(**) generating or pre-storing (generating) a decimal digit corresponding to a binary digit obtained through reverse of a binary digit represented by $n_{max}$ bits of each element in [0, 1, ..., $2^{n_{max}}$], to obtain a sequence $[a_0, a_1, \ldots, a_{2^{n_{max}}}]$; and
(***) removing an element whose value is greater than or equal to M_c in $[a_0, a_1, \ldots, a_{2^{n_{max}}}]$, to obtain an $M_{\_}$-column sequence $[P(0), \ldots, P(M_{\_})]$; and Algorithm 5:
obtaining the permutation patterns of the column sequence numbers through PBR permutation of M bits with a cyclic shift by t1, wherein P(i)=PBR(mod(i+t1, $M_{\_}$), $M_{\_}$), wherein i=0, 1, 2, ..., or $M_{\_}$−1.

18. A communications apparatus, comprising:
a memory, configured to store a program; and
a processor, configured to execute the program stored in the memory, wherein when the program is executed, the processor is configured to perform steps according to claim 1.

* * * * *

UNITED STATES PATENT AND TRADEMARK OFFICE
CERTIFICATE OF CORRECTION

PATENT NO. : 11,082,070 B2  
APPLICATION NO. : 16/728020  
DATED : August 3, 2021  
INVENTOR(S) : Hui Shen Page 1 of 1

It is certified that error appears in the above-identified patent and that said Letters Patent is hereby corrected as shown below:

In the Claims

Lines 46-53 of Column 23 Claim 9: be replaced with:
if $M\_$ is an integer power of 2, in other words, $M\_=2^n$, simplifying PBR(i, $M\_$) as bit reverse (Bit Reverse)–based mapping, wherein the simplifying comprises: (a) representing i by a binary digit represented by n bits; (b) reversing the binary digit to obtain a reversed binary digit; and (c) converting the reversed binary digit into a decimal digit, wherein the decimal digit is P(i);

Lines 15-22 of Column 26 Claim 17: be replaced with:
if $M\_$ is an integer power of 2, in other words, $M\_=2^n$, simplifying PBR(i, $M\_$) as bit reverse (Bit Reverse)–based mapping, wherein the simplifying specifically comprises: (a) representing i by a binary digit represented by n bits; (b) reversing the binary digit to obtain a reversed binary digit; and (c) converting the reversed binary digit into a decimal digit, wherein the decimal digit is P(i);

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*